(12) United States Patent
Ji et al.

(10) Patent No.: US 12,225,766 B2
(45) Date of Patent: Feb. 11, 2025

(54) DISPLAY DEVICE AND MANUFACTURING METHOD THEREFOR

(71) Applicant: Samsung Display Co., LTD., Yongin-si (KR)

(72) Inventors: Seon Beom Ji, Seoul (KR); Min Soo Kim, Seoul (KR); Seung Min Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 497 days.

(21) Appl. No.: 17/602,575

(22) PCT Filed: Nov. 26, 2019

(86) PCT No.: PCT/KR2019/016397
§ 371 (c)(1),
(2) Date: Oct. 8, 2021

(87) PCT Pub. No.: WO2020/209465
PCT Pub. Date: Oct. 15, 2020

(65) Prior Publication Data
US 2022/0181408 A1    Jun. 9, 2022

(30) Foreign Application Priority Data
Apr. 10, 2019  (KR) ........................ 10-2019-0042149

(51) Int. Cl.
| | | |
|---|---|---|
| *H01L 27/32* | (2006.01) | |
| *H10K 59/12* | (2023.01) | |
| *H10K 71/00* | (2023.01) | |
| *H10K 77/10* | (2023.01) | |
| *H10K 102/00* | (2023.01) | |

(52) U.S. Cl.
CPC ............. *H10K 59/12* (2023.02); *H10K 71/00* (2023.02); *H10K 59/1201* (2023.02); *H10K 77/111* (2023.02); *H10K 2102/311* (2023.02)

(58) Field of Classification Search
CPC .... H10K 59/12; H10K 71/00; H10K 59/1201; H10K 77/111; H10K 2102/311;
(Continued)

(56) References Cited

U.S. PATENT DOCUMENTS

| | | |
|---|---|---|
| 9,430,180 B2 | 8/2016 | Hirakata et al. |
| 9,535,522 B2 | 1/2017 | Ahn |
| 2019/0293998 A1* | 9/2019 | Hasegawa ............. G02F 1/1333 |

FOREIGN PATENT DOCUMENTS

| | | | | |
|---|---|---|---|---|
| CN | 108630824 A | * | 10/2018 | ........... H01L 23/544 |
| CN | 109148512 A | | 1/2019 | |

(Continued)

OTHER PUBLICATIONS

International Search Report mailed Mar. 27, 2020 for PCT/KR2019/016397.

(Continued)

*Primary Examiner* — Shahed Ahmed
(74) *Attorney, Agent, or Firm* — CANTOR COLBURN LLP

(57) ABSTRACT

A display device includes: a display region and a non-display region surrounding the display region; a first bending line defined on the display region, where the first bending line includes a portion extending in a first direction; a first region located at one side of the first bending line; a second region located at the other side of the first bending line and bent from the first region in one direction; a first alignment mark disposed in the first area and having a first area; and a second alignment mark disposed in the second area and facing toward the first alignment mark while the first bending line is disposed between the first and second alignment marks. The second alignment mark has a second area different from the first area.

15 Claims, 23 Drawing Sheets

(58) Field of Classification Search
CPC .......... H10K 59/871; H10K 59/10–221; G02F 1/13; G02F 1/1333; G02F 1/1303; G02F 1/133354; G02F 1/133374; H01L 27/1214–1296; H01L 33/00–648; H01L 2933/00–0091; H01L 23/544; H01L 2223/54426
See application file for complete search history.

(56) References Cited

FOREIGN PATENT DOCUMENTS

| | | | |
|---|---|---|---|
| EP | 3188275 A1 * | 7/2017 | ......... H01L 27/3246 |
| JP | 4651886 B2 | 3/2011 | |
| JP | 2018170498 A | 11/2018 | |
| KR | 100853298 B1 | 8/2008 | |
| KR | 1020140065284 A | 5/2014 | |
| KR | 1020160110688 A | 9/2016 | |
| KR | 1020170040433 A | 4/2017 | |
| KR | 1020170104102 A | 9/2017 | |
| KR | 1020180027665 A | 3/2018 | |
| KR | 1020180078413 A | 7/2018 | |
| KR | 1020180127606 A | 11/2018 | |

OTHER PUBLICATIONS

Korean Office Action—Korean Application No. 10-2019-0042149 dated Nov. 20, 2023.

* cited by examiner

[FIG. 1]
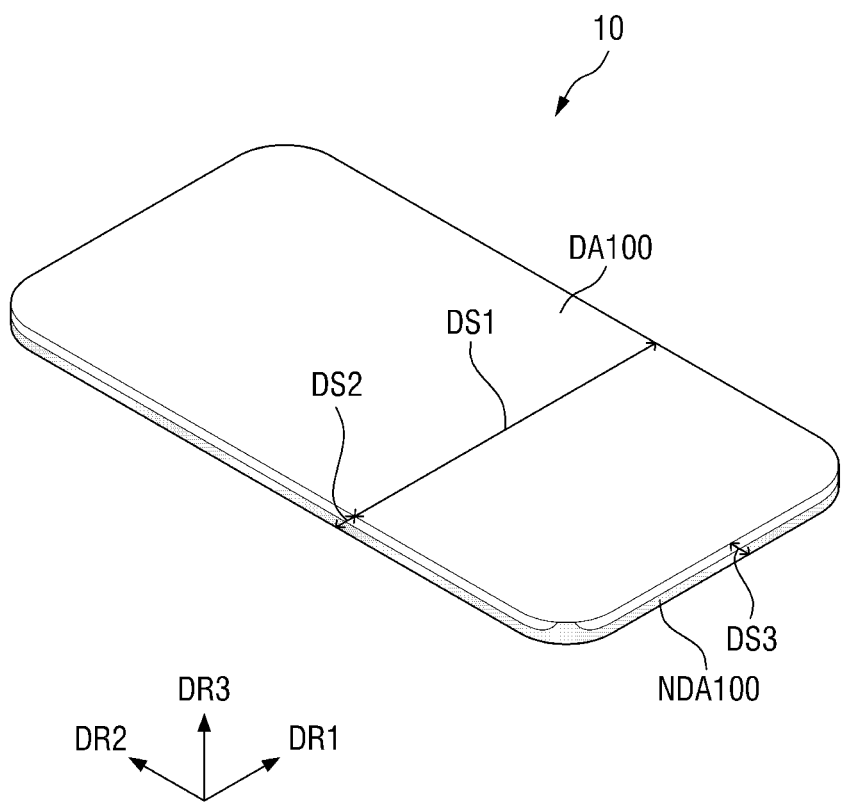

[FIG. 2]
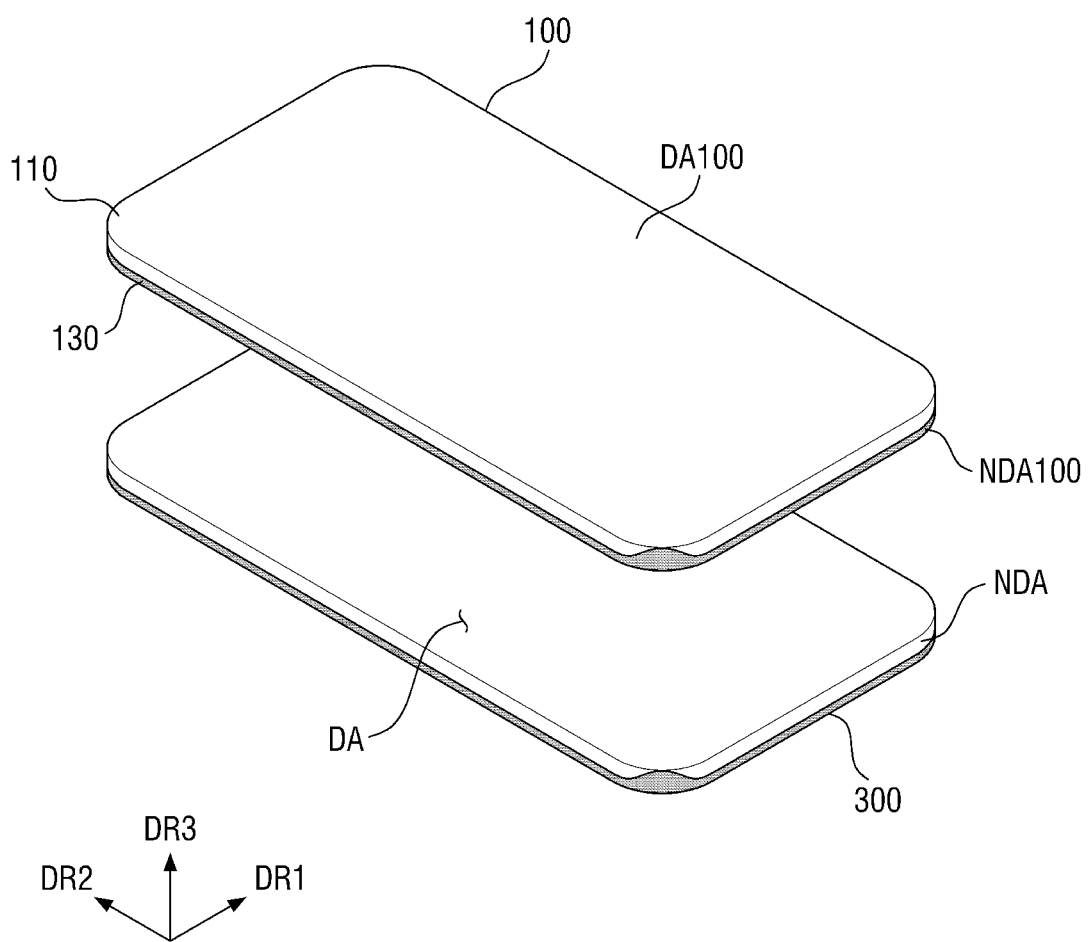

[FIG. 3]
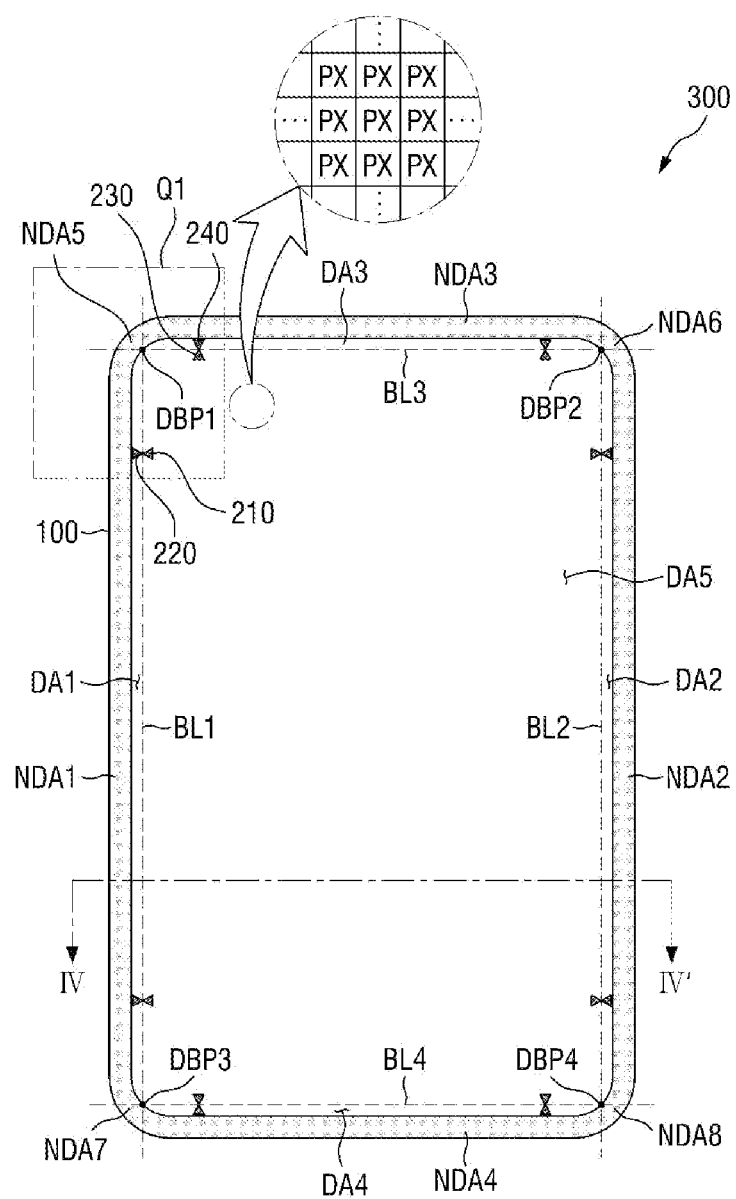
DA: DA1, DA2, DA3, DA4, DA5
NDA: NDA1, NDA2, NDA3, NDA4, NDA5, NDA6, NDA7, NDA8
200: 210, 220, 230, 240
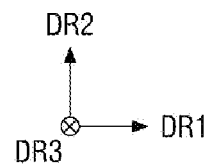

[FIG. 4]
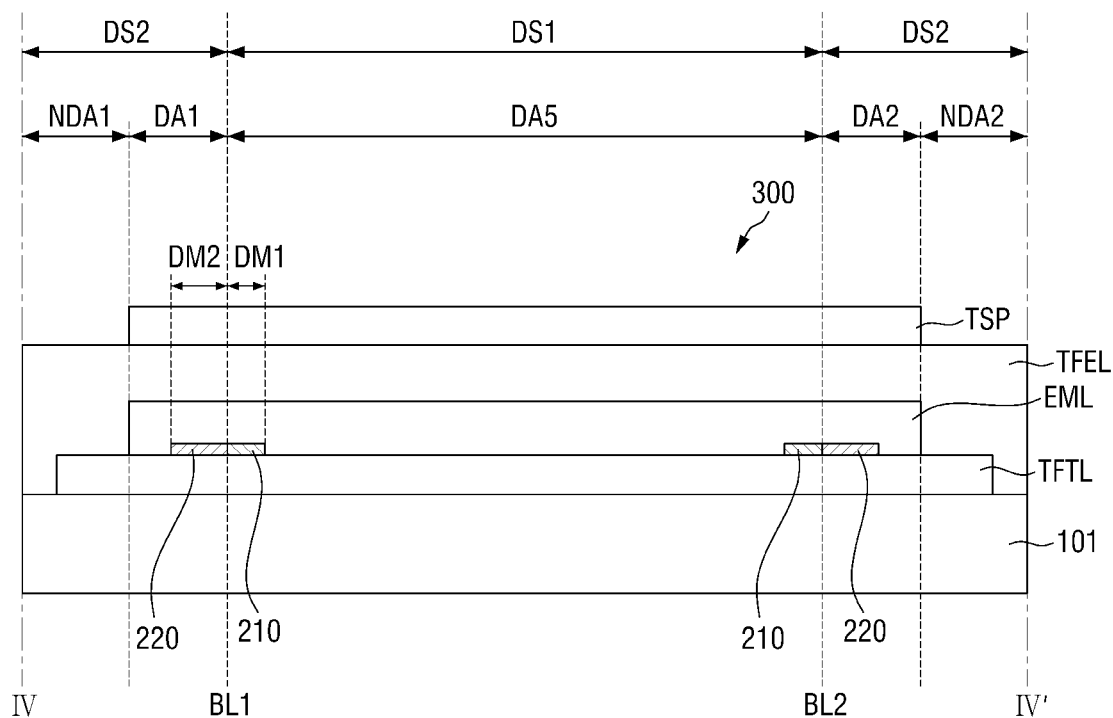
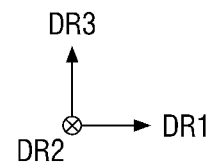

[FIG. 5]
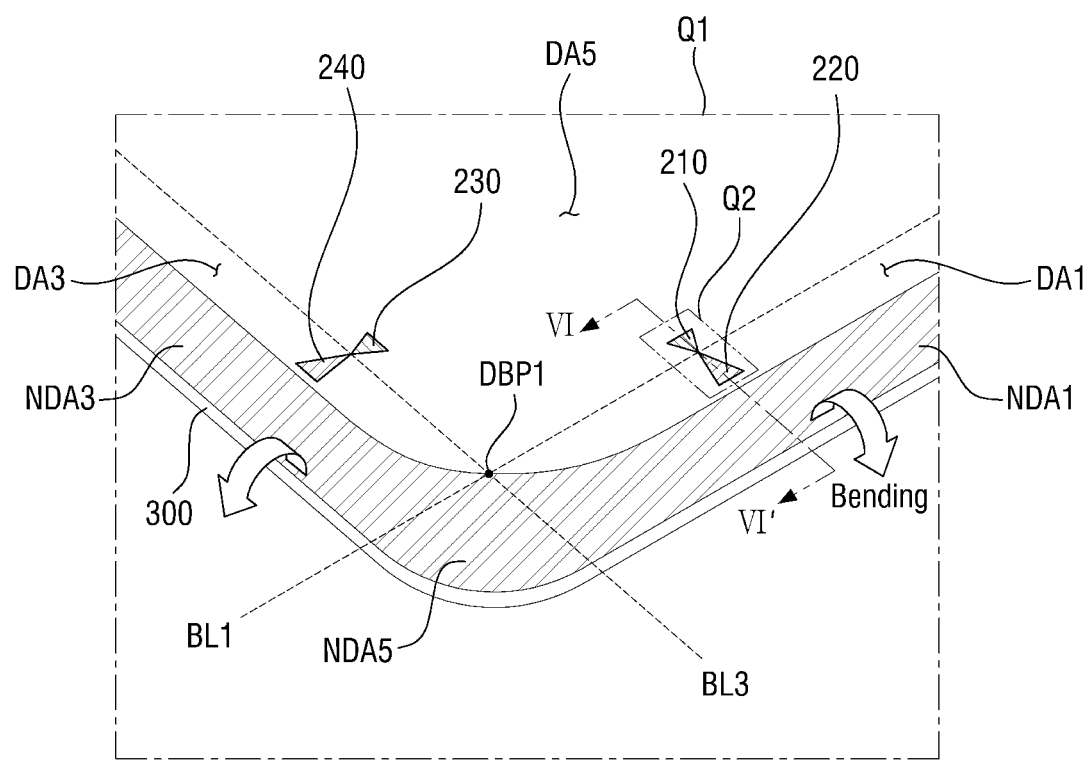

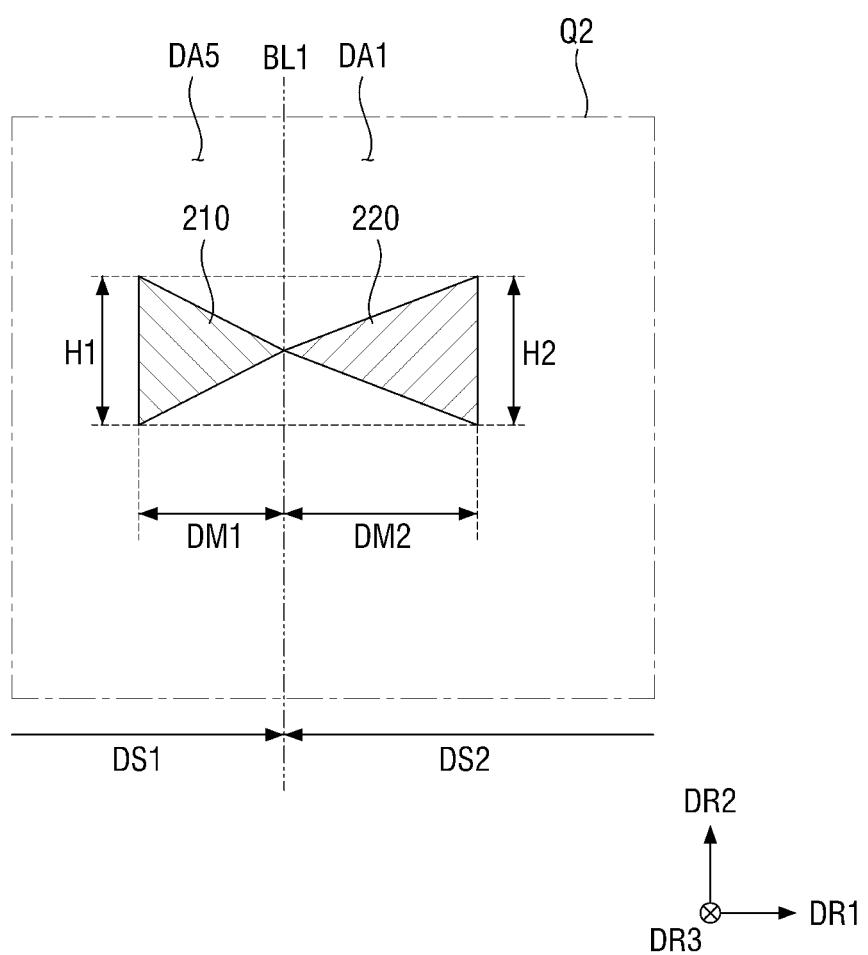
[FIG. 7]

[FIG. 8]
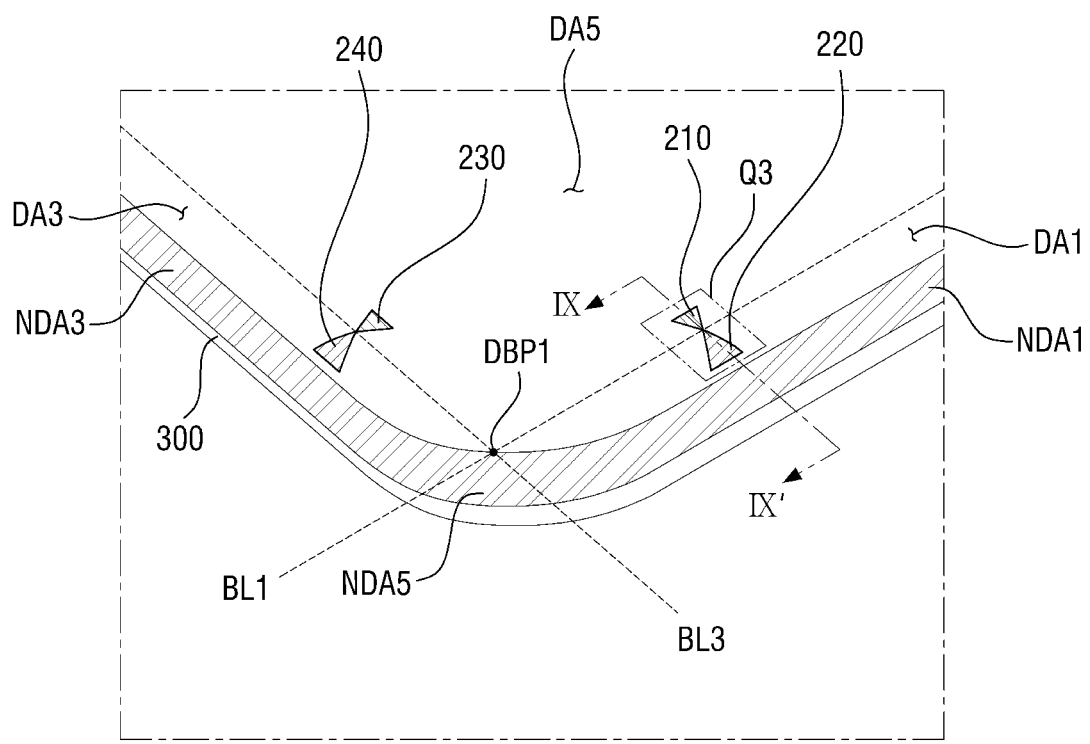
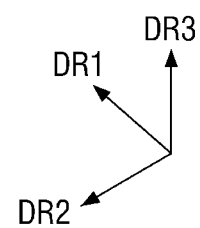

[FIG. 10]
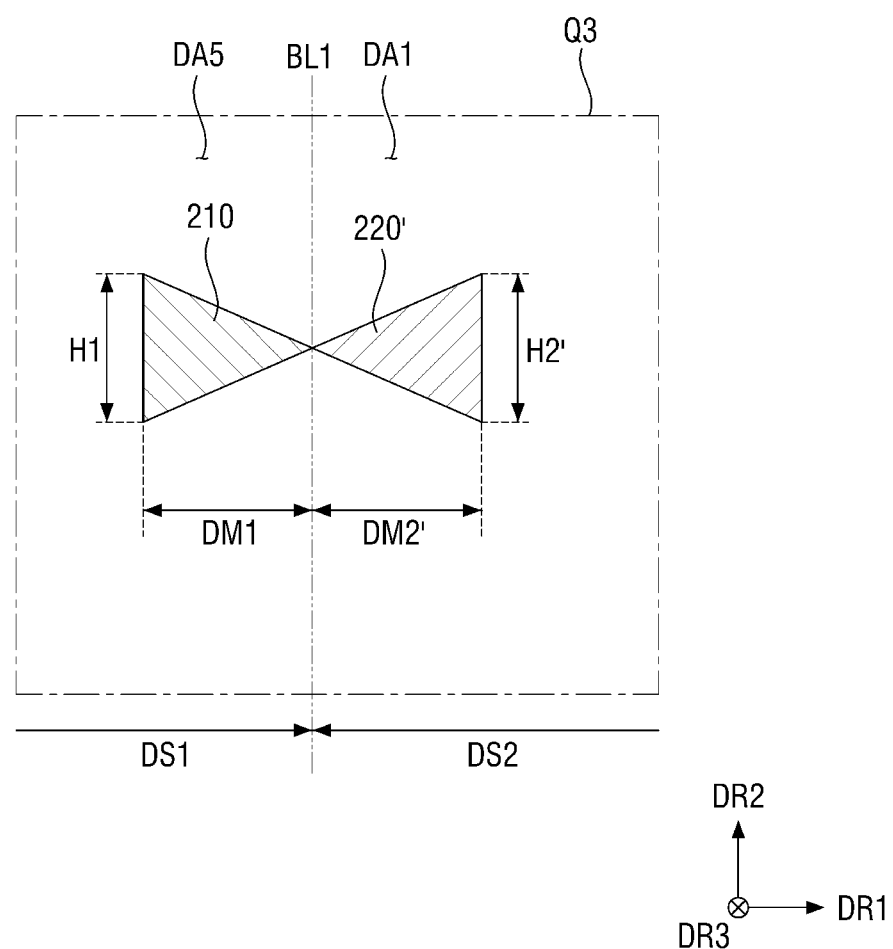

[FIG. 11]
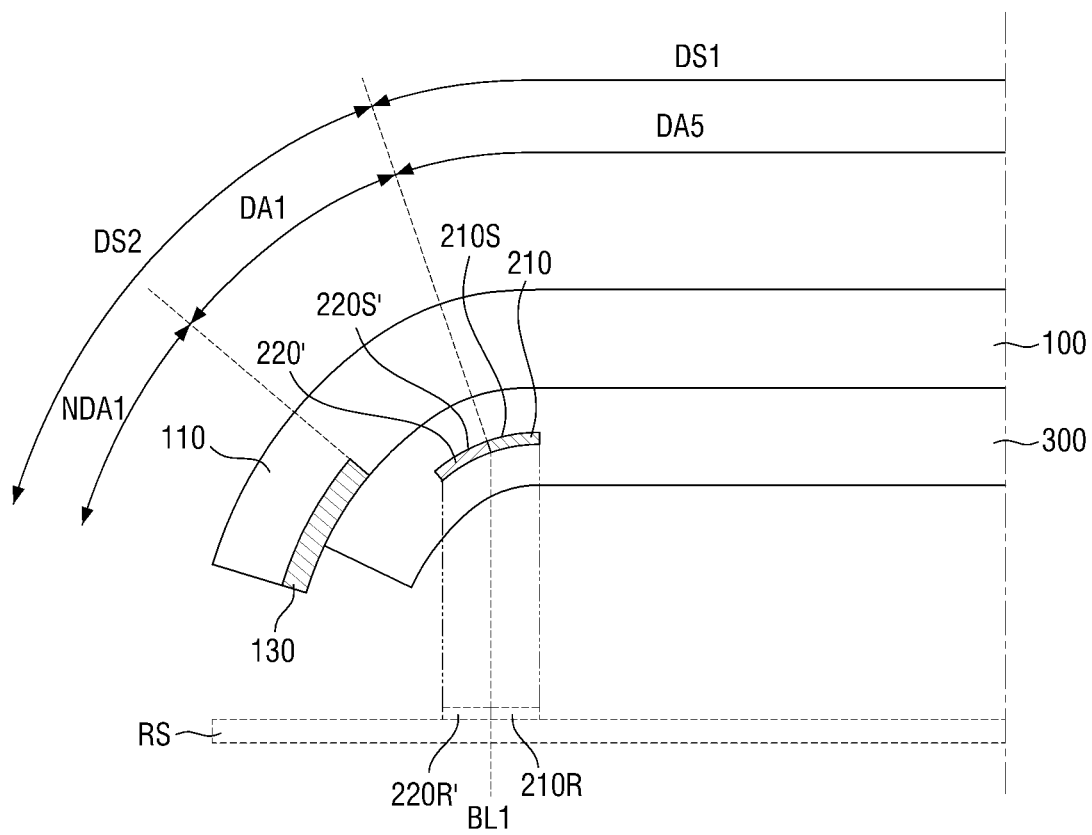

[FIG. 12]
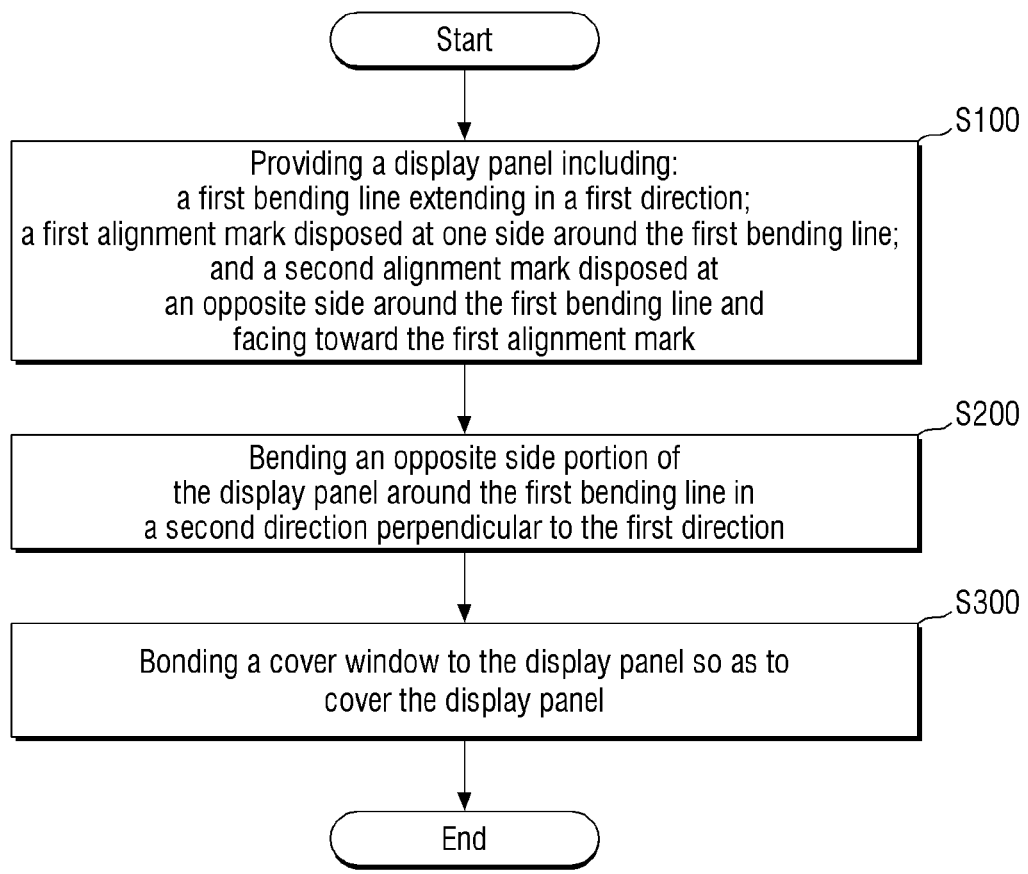

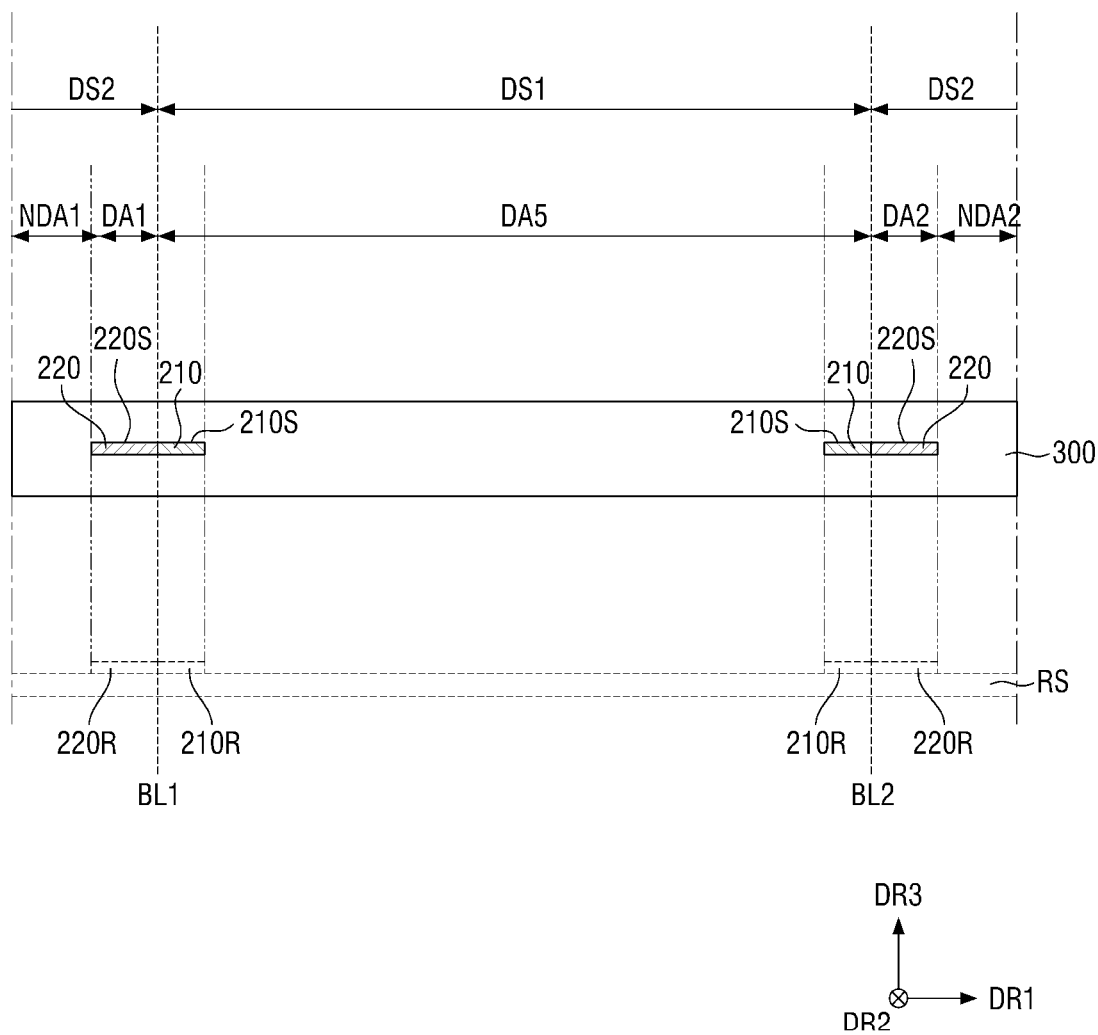
[FIG. 13]

[FIG. 14]
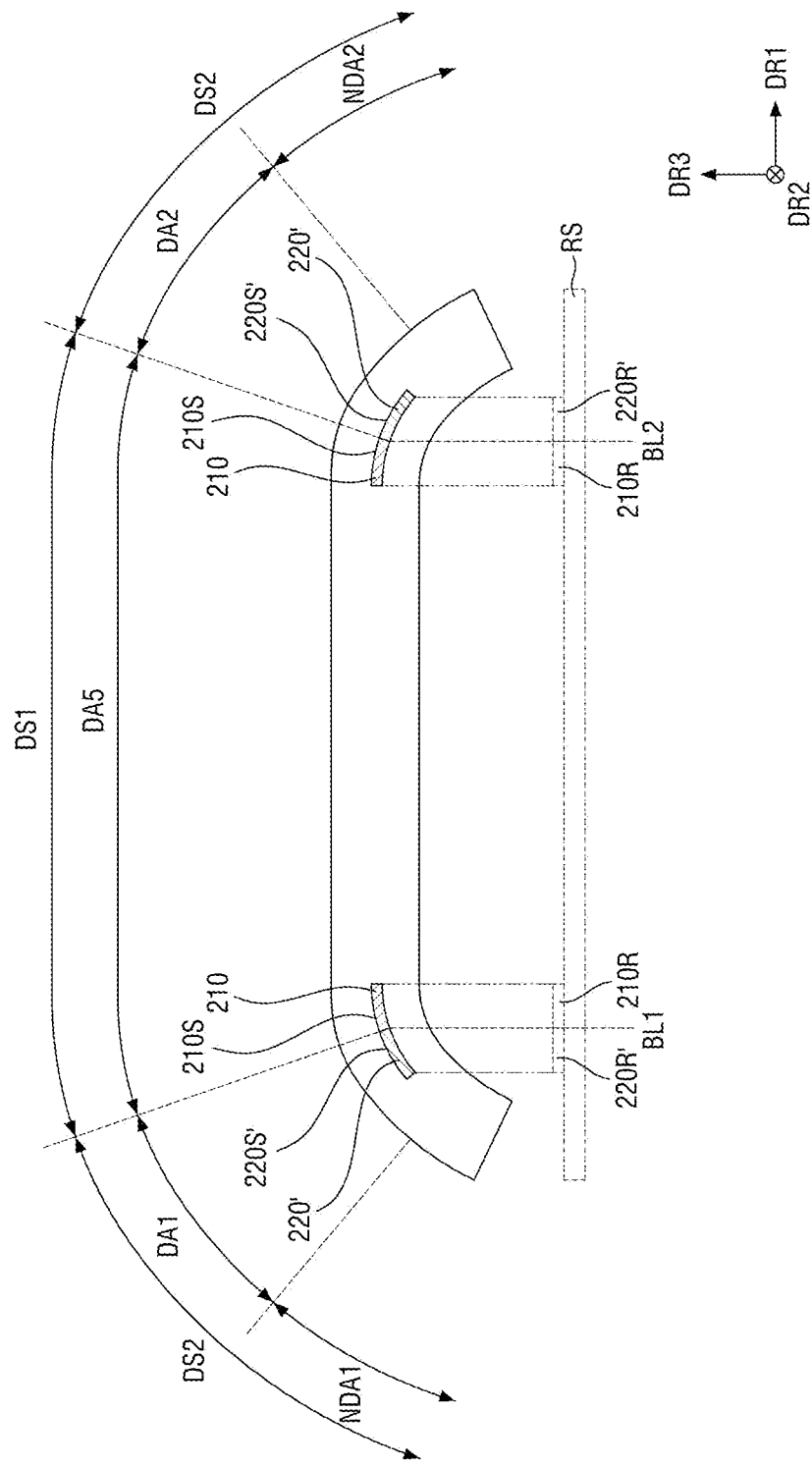

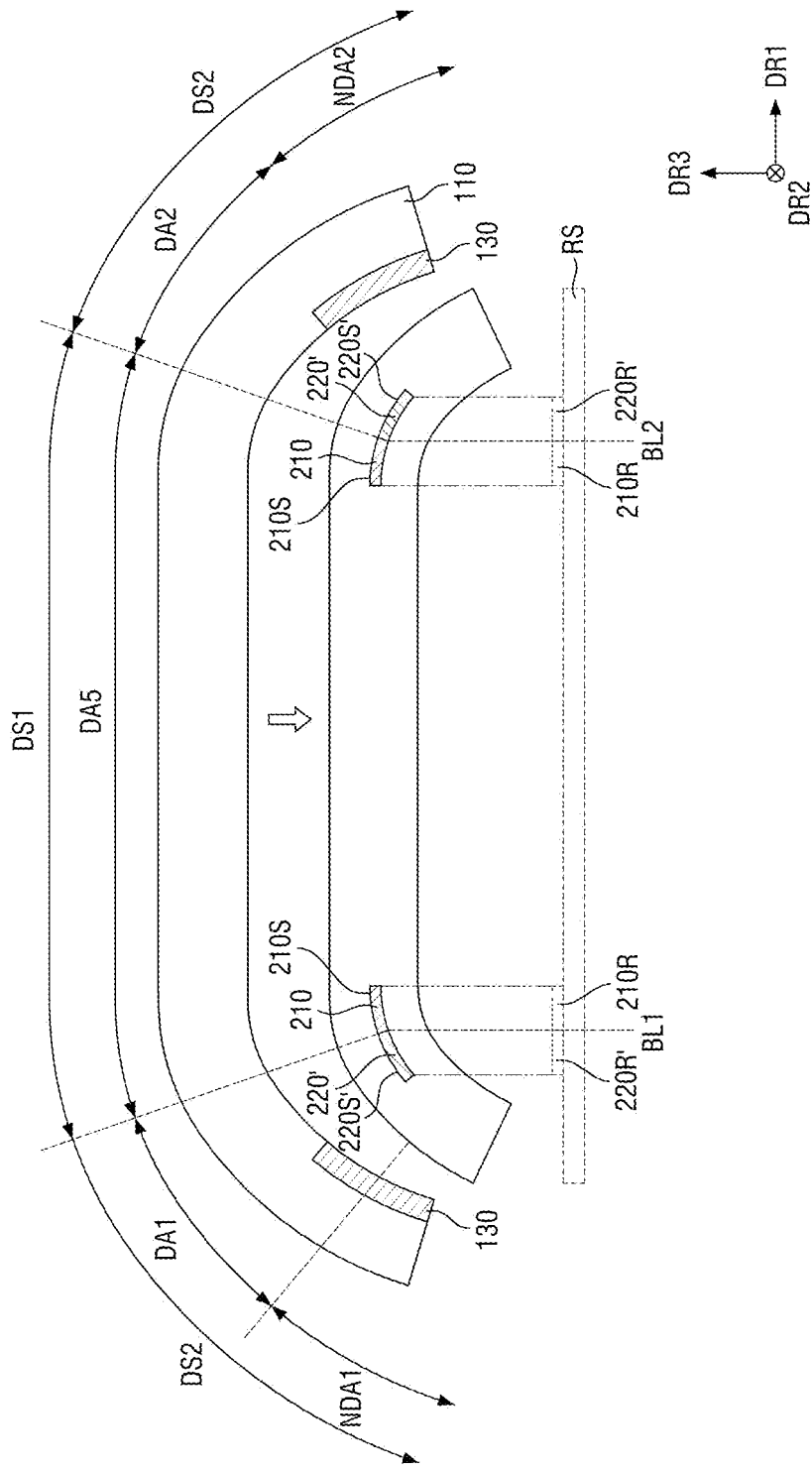
[FIG. 15]

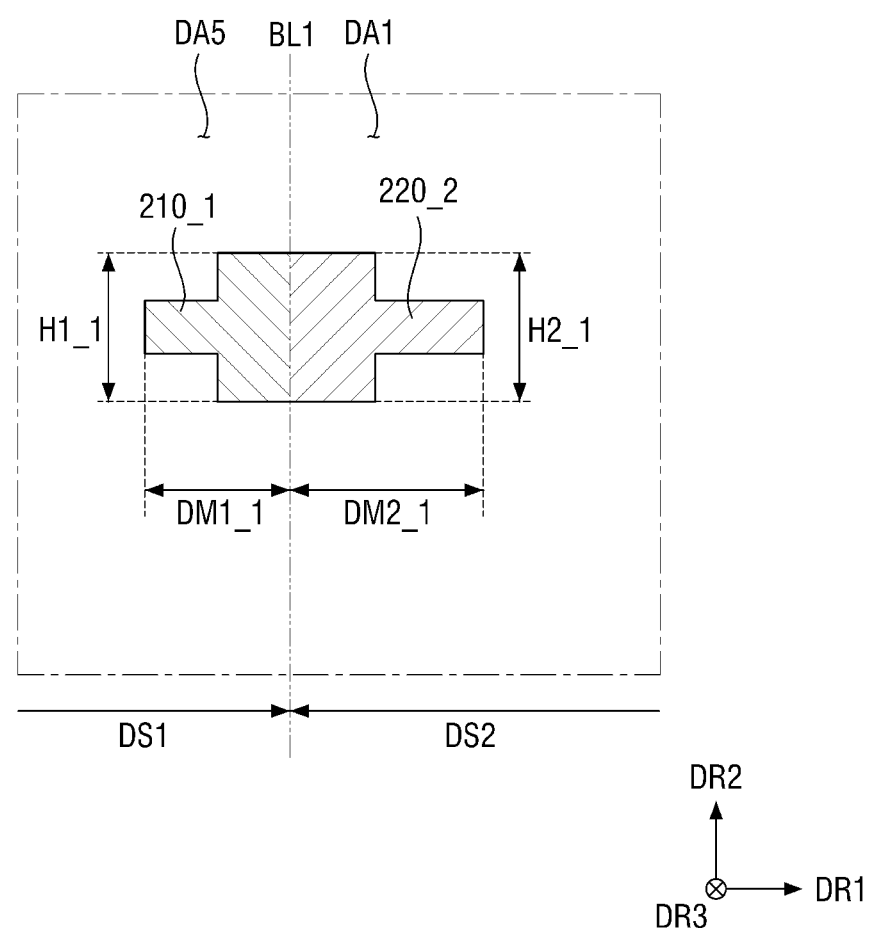
[FIG. 16]

[FIG. 17]
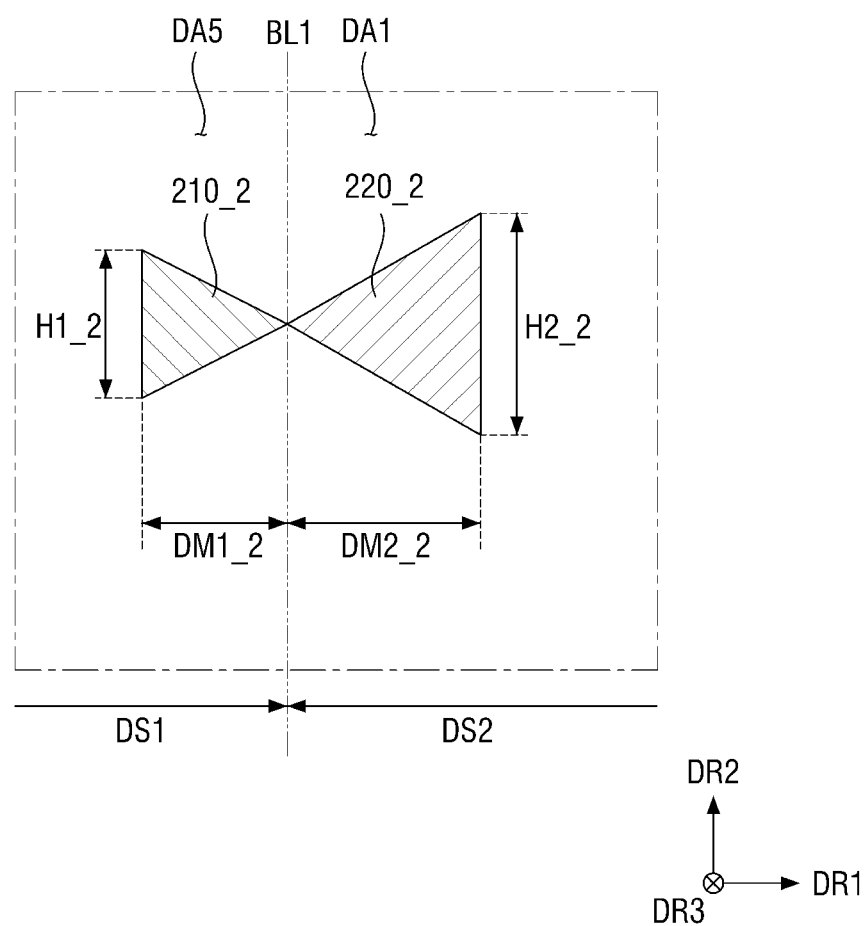

[FIG. 18]
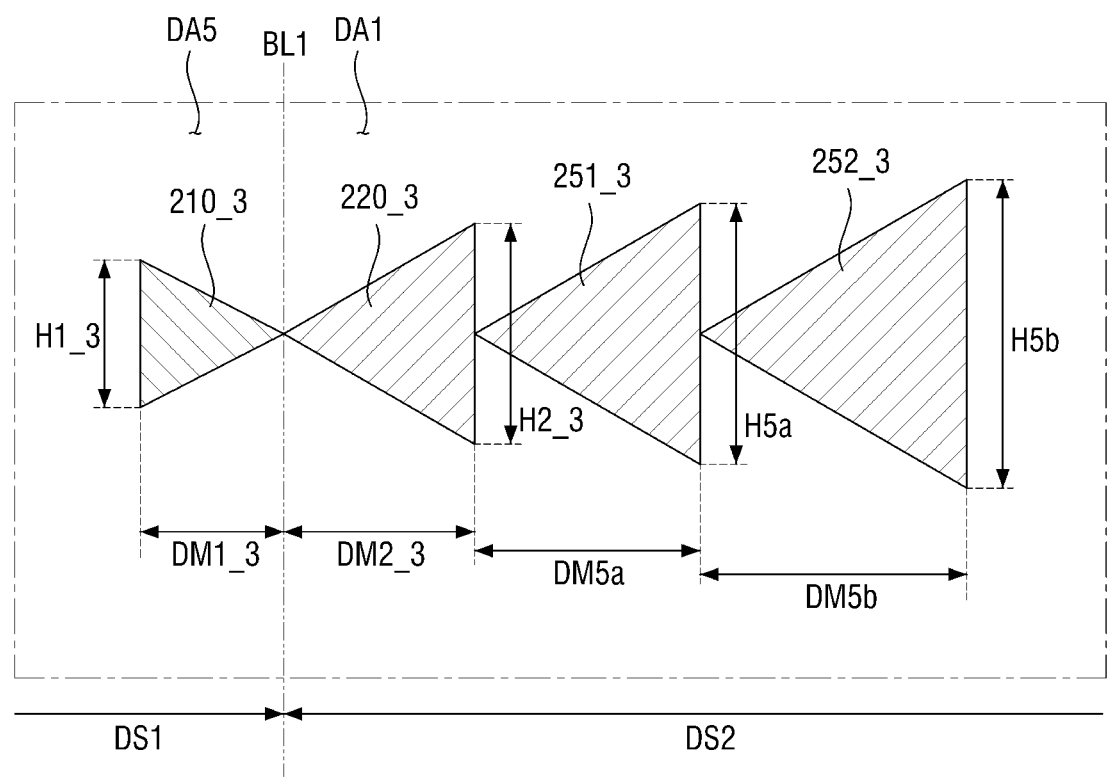

[FIG. 19]
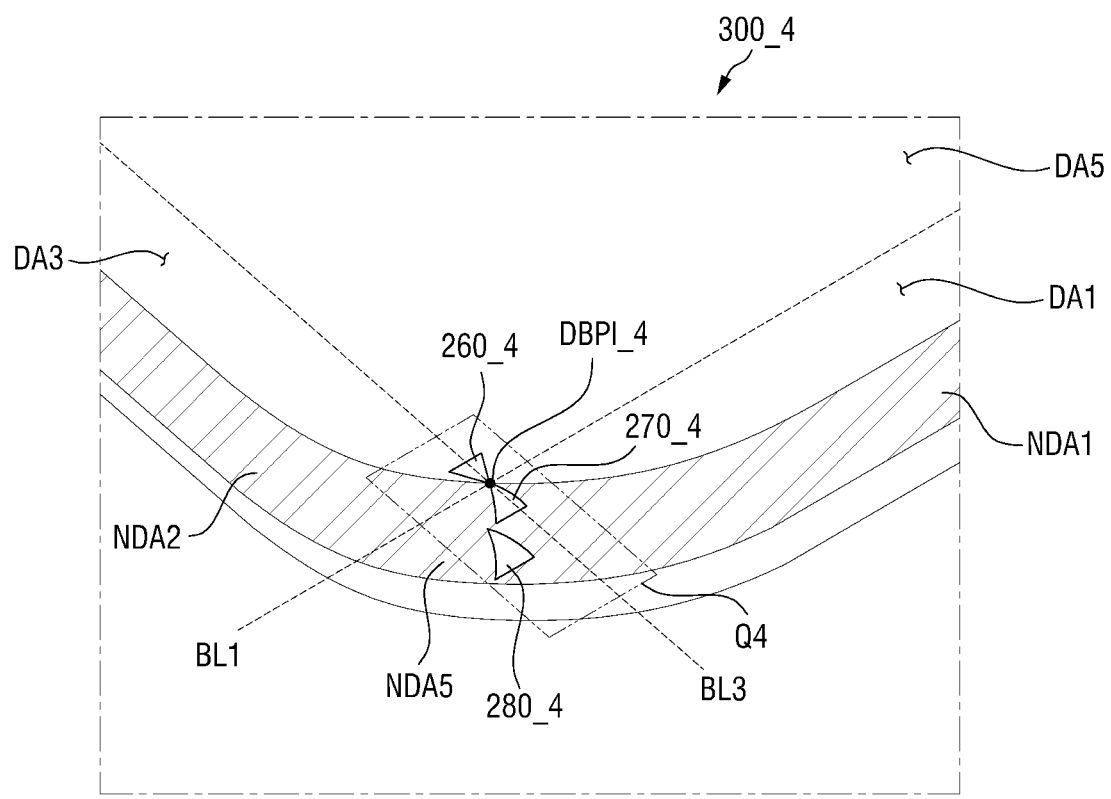

[FIG. 20]
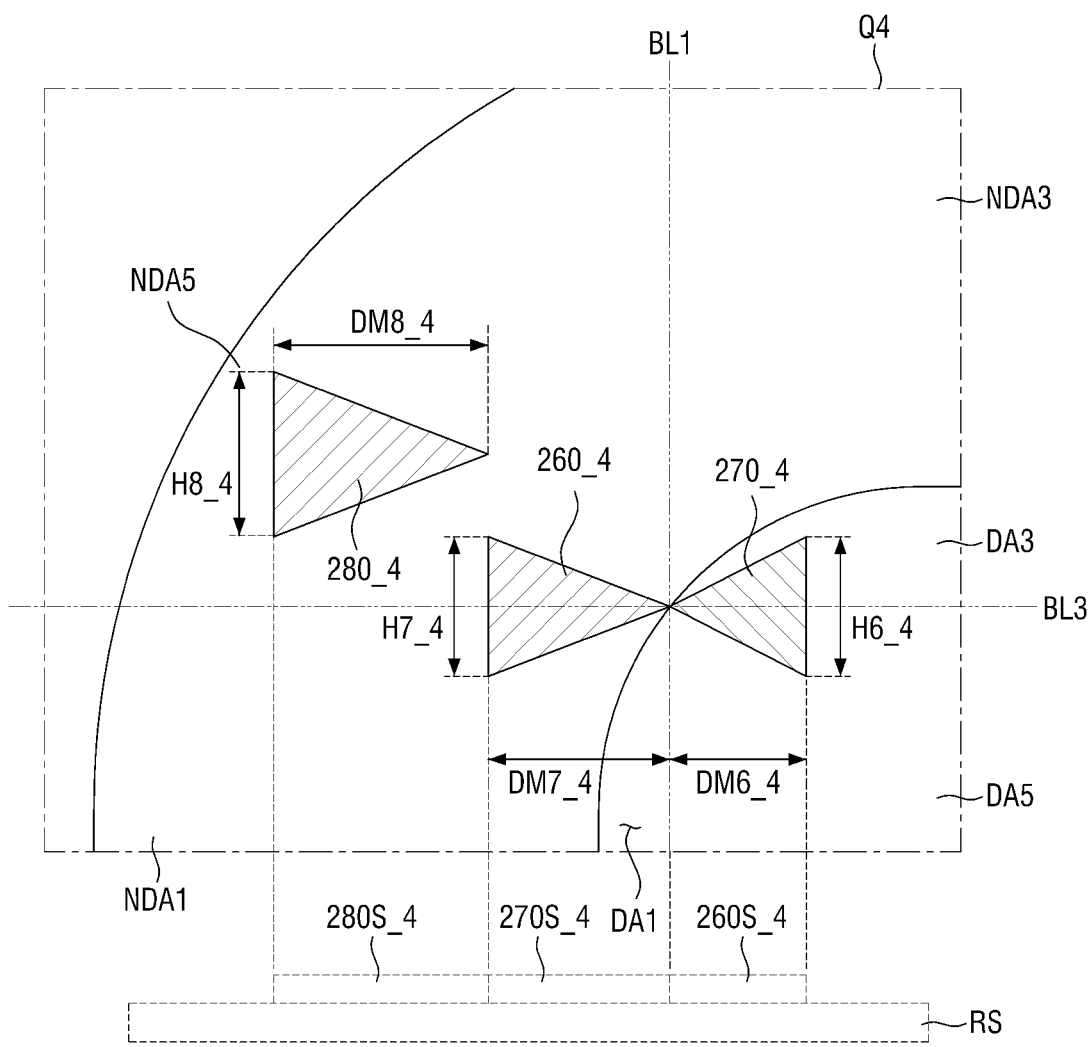

[FIG. 21]
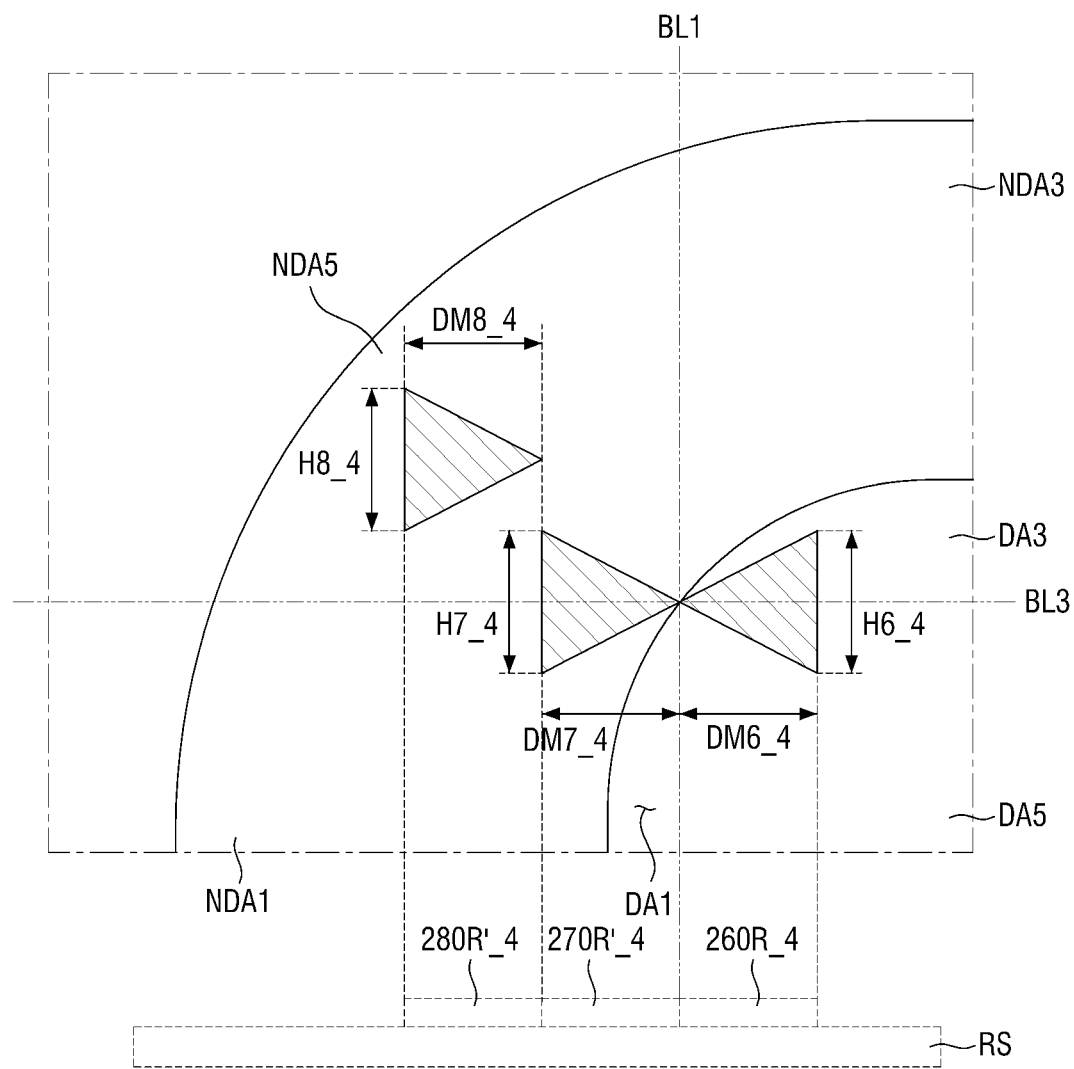

[FIG. 22]
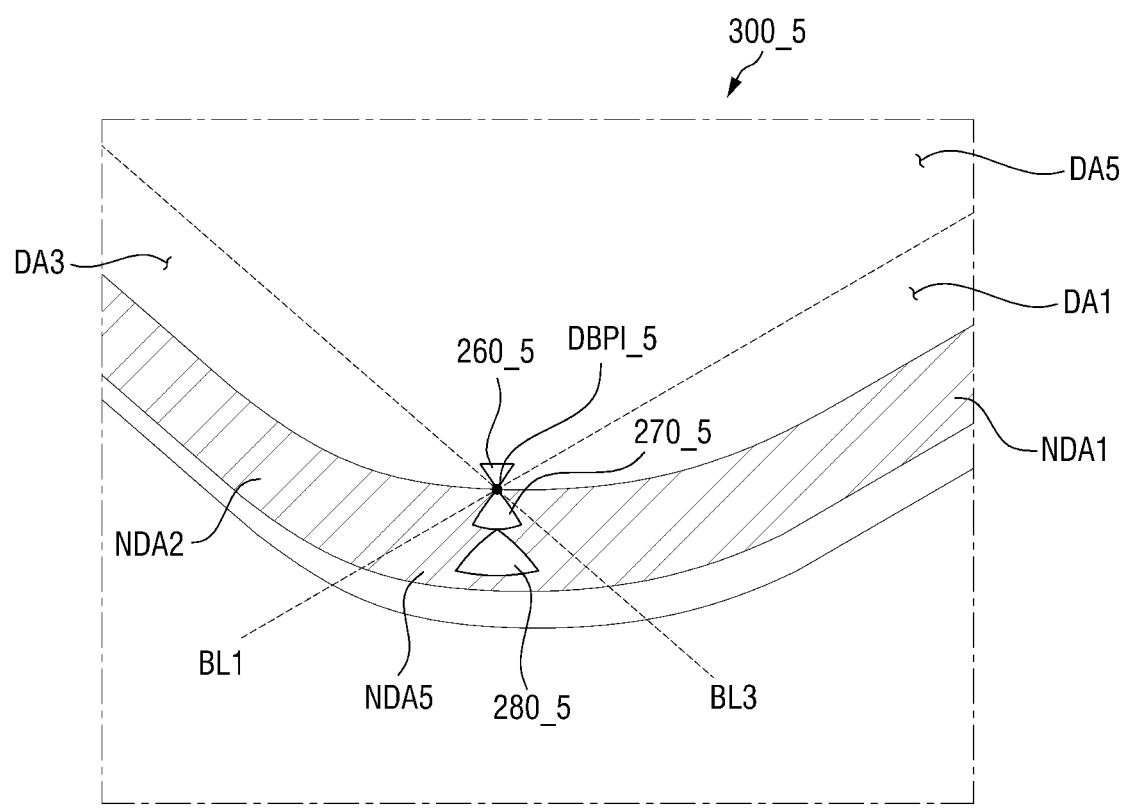
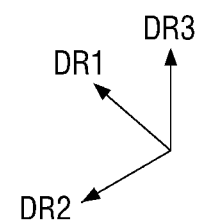

[FIG. 23]
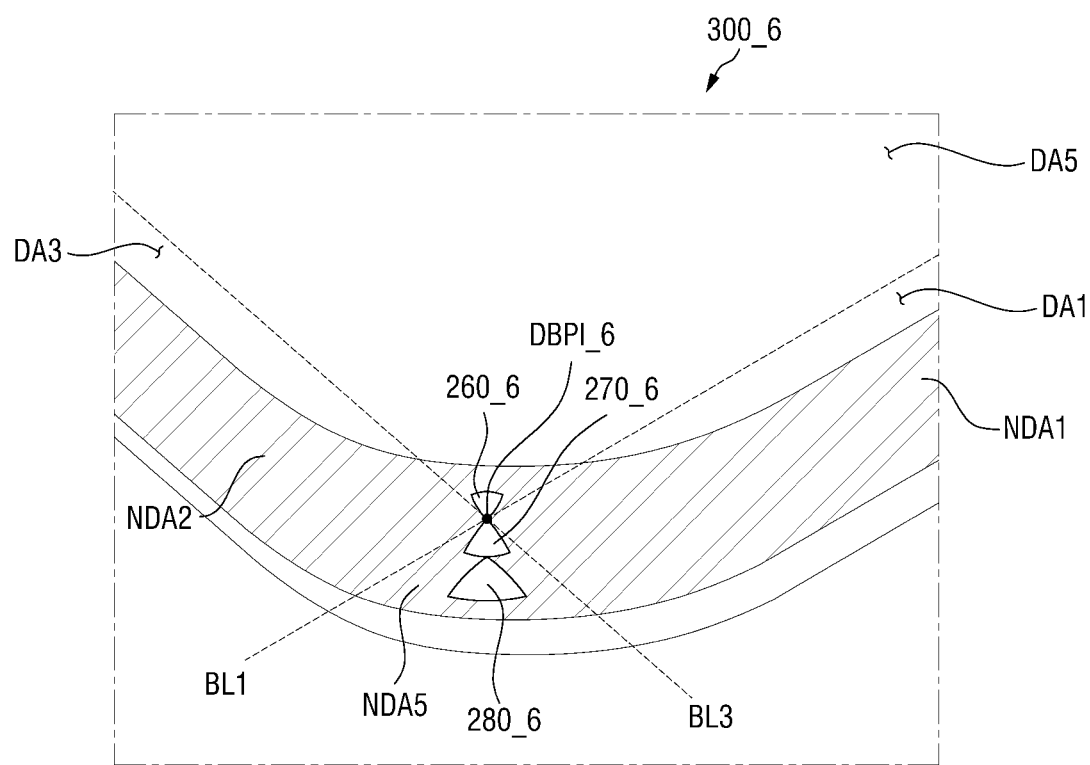

DISPLAY DEVICE AND MANUFACTURING METHOD THEREFOR

CROSS-REFERENCE TO RELATED APPLICATION

This application claims priority from Korean Patent Application No. 10-2019-0042149 filed on Apr. 10, 2019, and all the benefits accruing therefrom under 35 U.S.C. 119, the contents of which in its entirety are herein incorporated by reference.

TECHNICAL FIELD

The disclosure relates to a display device and a method for manufacturing the display device.

BACKGROUND ART

Electronic devices such as smart phones, tablet personal computers ("PC"s), digital cameras, notebook computers, navigation devices, and smart televisions ("TV"s) that provide images to users include display devices for displaying the images. The display device includes a display panel that generates and displays an image, and various input means.

Among the display devices, an organic light-emitting display device displays an image using an organic light-emissive element that generates light via recombination between electrons and holes. The organic light-emitting display device has a fast response speed, high luminance, a large viewing angle, and operates at a low power consumption.

A display device generally displays an image only on a front face thereof. However, recently, a display device that displays an image also on a side face thereof has been developed.

DISCLOSURE

Technical Problem

Embodiments of the disclosure provide a display device including an alignment mark disposed on a side face in a display area of a display panel.

Embodiments of the disclosure also provide a method for manufacturing a display device which includes a plurality of alignment marks and has a curved portion of a display area thereof.

It should be noted that aspects of the disclosure are not limited thereto and other aspects, which are not mentioned herein, will be apparent to those of ordinary skill in the art from the following description.

Technical Solution

According to an embodiment of the disclosure, a display device includes a display area and a non-display area surrounding the display area, a first bending line defined on the display area, where the first bending line includes a portion extending in a first direction and on the display area, a first area located at one side around the first bending line, a second area located at an opposite side around the first bending line, where the second is bent in one direction relative to the first area and from the first bending line, a first alignment mark disposed in the first area and having a first area, and a second alignment mark disposed in the second area and facing toward the first alignment mark while the first bending line is disposed between the first and second alignment marks, where the second alignment mark has a second area different from the first area.

In an embodiment, the display area may include a first display area disposed in the first area around the first bending line, and a second display area disposed in the second area around the first bending line, where the first alignment mark may be disposed in the first display area, and the second alignment mark may be disposed in the second display area.

In an embodiment, a first side of the first alignment mark and a second side of the second alignment mark may contact each other at the first bending line, where the second area may be larger than the first area.

In an embodiment, a first second-directional dimension of the first alignment mark measured in a second direction perpendicular to the first direction may be smaller than a second second-directional dimension of the second alignment mark measured in the second direction.

In an embodiment, a first first-directional dimension of the first alignment mark measured in the first direction may be smaller than a second first-directional dimension of the second alignment mark measured in the first direction.

In an embodiment, an imaginary reference surface parallel to the first area and spaced apart from the first area in a third direction in which the second area is bent may be defined, where a size of a first orthogonal projection area of the first alignment mark projected in the third direction onto the imaginary reference surface may be the same as a size of a second orthogonal projection area of the second alignment mark projected in the third direction onto the imaginary reference surface.

In an embodiment, the display device may further include a third alignment mark spaced apart from and facing toward the first alignment mark while the first bending line is disposed therebetween, where the third alignment mark may be disposed in the second area, and has a third area larger than the second area.

In an embodiment, a size of a third orthogonal projection area of the third alignment mark projected in the third direction onto the imaginary reference surface may be the same as a size of each of the first orthogonal projection area and the second orthogonal projection area.

In an embodiment, the display device may further include a second bending line extending in a second direction perpendicular to the first direction, where the second bending line may intersect the first bending line, and the first area may be disposed at one side around the second bending line, and a third area located at an opposite side around the second bending line, where the third area may be bent in one direction relative to the first area and from the second bending line, where the display area may further include a third display area disposed in the third area around the second bending line.

In an embodiment, the display device may further include a fourth alignment mark disposed in the first area and having a fourth area, and a fifth alignment mark disposed in the third area and facing toward the fourth alignment mark while the second bending line is disposed between the fourth and fifth alignment marks, where the fifth alignment mark may have a fifth area different from the fourth area.

In an embodiment, the non-display area may include a first non-display area extending in the first direction, disposed in the second area, and located on one side of the second display area, a second non-display area extending in the second direction, disposed in the third area, and located on one side of the third display area, and a third non-display area located in an area where the first non-display area and the second non-display area intersect with each other, where a bending intersection point as an intersection point between the first bending line and the second bending line may be disposed at a boundary between the third non-display area and the first display area.

In an embodiment, the display device may further include a sixth alignment mark disposed in the first area, having a sixth area, and having a sixth side contacting the bending intersection point, and a seventh alignment mark disposed in the third non-display area and facing toward the sixth alignment mark while the bending intersection point is disposed between the sixth and seventh alignment marks, where the seventh alignment mark may have a seventh area different from the sixth area.

In an embodiment, the display device may further comprise an eighth alignment mark spaced from the first bending line and the second bending line and disposed in the third non-display area, where the eight alignment mark may have an eighth area larger than the seventh area.

According to an embodiment of the disclosure, a display device includes a first bending line extending in a first direction, a second bending line extending in a second direction perpendicular to the first direction and intersecting the first bending line, a first area surrounded with the first bending line and the second bending line, a second area bent from the first bending line, a third area bent from the second bending line, a fourth area where the second area and the third area intersect with each other, a first alignment mark disposed on the first area and having a first area, and a second alignment mark disposed in at least one selected from the second area, the third area and the fourth area, where the second alignment marks has a second area larger than the first area, and the second alignment mark faces toward the first alignment mark.

In an embodiment, the second alignment mark disposed in the second area and the first alignment mark may contact each other at the first bending line, where the second alignment mark disposed in the third area and the first alignment mark may contact with each other at the second bending line.

In an embodiment, the second alignment mark disposed in the fourth area may be spaced apart from each of the first bending line and the second bending line.

According to an embodiment of the disclosure, a method for manufacturing a display device includes providing a display panel including a first bending line extending in a first direction, a first alignment mark disposed at one side around the first bending line, and a second alignment mark disposed at an opposite side around the first bending line and facing toward the first alignment mark, bending an opposite side portion of the display panel around the first bending line in a second direction perpendicular to the first direction, and bonding a cover window to the display panel to cover the display panel.

In an embodiment, the bending the display panel may include defining a reference surface parallel to a face of the display panel disposed at one side around the first bending line and spaced apart from the face in the second direction, measuring a size of a first orthogonal projection area of the first alignment mark projected onto the reference surface, and a size of a second orthogonal projection area of the second alignment mark projected onto the reference surface, and comparing the size of the first orthogonal projection area with the size of the second orthogonal projection area.

In an embodiment, in the display panel bent in a bent state after the bending the display panel, a size of the first orthogonal projection area and a size of the second orthogonal projection area may be equal to each other.

In an embodiment, the display panel may include a second bending line extending in a third direction perpendicular to both of the first direction and the second direction, a third alignment mark disposed at one side around the second bending line, and a fourth alignment mark disposed at an opposite side around the second bending line, where the bending the display panel may include bending an opposite side portion of the display panel around the second bending line until a size of a third orthogonal projection area of the third alignment mark projected onto the reference surface may become equal to a size of a fourth orthogonal projection area of the fourth alignment mark projected onto the reference surface.

The details of other embodiments are included in the detailed description and the accompanying drawings.

Advantageous Effects

Embodiments of the display device may include the first alignment mark and the second alignment mark having different sizes while a bending line is disposed therebetween. The first alignment mark may be disposed in an uncurved area of the display device, and the second alignment mark may be disposed in a curved area of the display device. When the display device or the display panel is bent in a bending direction, a size of an area of the second alignment mark as viewed in the bending direction may change.

Accordingly, the method for manufacturing the display device according to an embodiment may calculate a bent degree of the display device or the display panel based on a measuring result of a change in a size of the area of the second alignment mark viewed in the bending direction, that is, the orthogonal projection area. Alternatively, when the size of the second alignment mark may be designed such that sizes of the orthogonal projection area of the first alignment mark and the orthogonal projection area of the second alignment mark are equal to each other when the display device or the display panel is bent at a preset bent angle. Thus, in the manufacturing process of the display device, the orthogonal projection area of the second alignment mark may be compared with the orthogonal projection area of the first alignment mark. Thus, the display device may be bent to reach the preset bent angle, based on the comparing result.

The effects according to the embodiments are not limited by the contents exemplified above, and more various effects are included in this disclosure.

DESCRIPTION OF DRAWINGS

FIG. 1 is a perspective view of a display device according to an embodiment.

FIG. 2 is an exploded perspective view of the display device of FIG. 1.

FIG. 3 is a plan view showing a display panel according to an embodiment.

FIG. 4 is a cross-sectional view taken along line IV-IV' in FIG. 3.

FIG. 5 is a schematic diagram showing a Q1 portion when the display panel of FIG. 3 is in a non-bent state.

FIG. 7 is a plan view showing a Q2 portion of FIG. 5.

FIG. 8 is a schematic diagram showing the Q1 portion when the display panel of FIG. 3 is in a bent state.

FIG. 10 is a plan view showing a Q3 portion of FIG. 9.

FIG. 11 is a cross-sectional view schematically showing a curved area of a display device according to an embodiment.

FIG. 12 is a flowchart showing a method for manufacturing a display device according to an embodiment.

FIG. 13 to FIG. 15 are cross-sectional views showing a method for manufacturing a display device according to an embodiment.

FIG. 16 and FIG. 17 are plan views showing a first alignment mark and a second alignment mark according to an alternative embodiment.

FIG. 18 is a plan view showing alignment marks according to an alternative embodiment.

FIG. 19 is an enlarged view showing a portion of a display panel according to an alternative embodiment.

FIG. 20 is a plan view showing a Q4 portion in a non-bent state of the display panel of FIG. 19.

FIG. 21 is a plan view showing the Q4 portion in a bent state of the display panel of FIG. 19.

FIG. 22 and FIG. 23 are enlarged views showing a portion of a display panel according to another alternative embodiment.

MODES OF THE INVENTION

Figure 6:
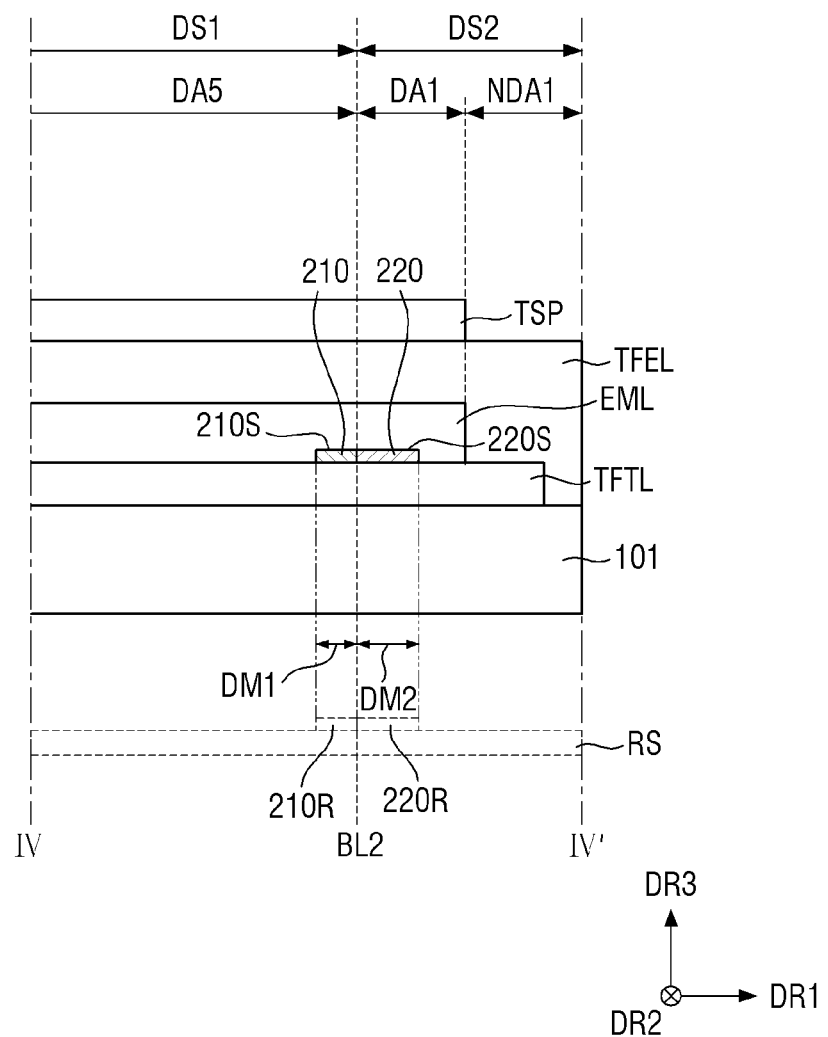
FIG. 6 is a cross-sectional view taken along line VI-VI' in FIG. 5.

The invention will now be described more fully hereinafter with reference to the accompanying drawings, in which various embodiments are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings herein. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the accompanying drawings.

FIG. 1 is a perspective view of a display device according to an embodiment.

FIG. 2 is an exploded perspective view of the display device of FIG. 1.

The display device 10 may refer to any electronic device that provides a display screen. In embodiments, the display device 10 may include portable electronic devices such as mobile phones, smart phones, tablet personal computers ("PC"s), electronic watches, smart watches, watch phones, mobile communication terminals, electronic notebooks, e-books, portable multimedia players ("PMP"s), navigation devices, game consoles, digital cameras, etc. which provide display screens, and televisions, laptops, monitors, billboards, Internet of Things ("IoT"), etc. which provide display screens.

Referring to FIG. 1 and FIG. 2, the display device 10 according to an embodiment includes a cover window 100 and a display panel 300.

As used herein, terms "upper", "top", and "top face" refer to a direction (that is, a third direction DR3) in which the cover window 100 is disposed on the display panel 300 in a thickness direction of the display panel 300, wherein terms "lower", "bottom", and "bottom face" refer to an opposite direction to the third direction DR3 in the thickness of the display panel 300. Further, terms "left", "right", "upper", and "lower" indicate directions in a plan view of the display panel 300. For example, "left" indicates a direction opposite to a first direction DR1, "right" indicates the first direction DR1, "upper" indicates a second direction DR2, and "lower" indicates a direction opposite to the second direction DR2.

The display device 10 may be in a rectangular planar shape. In one embodiment, for example, the display device 10 may have a rectangular planar shape having a short-side extending in the first direction DR1 and a long-side extending in the second direction DR2 as shown in FIG. 1. A corner where the short-side extending in the first direction DR1 and the long-side extending in the second direction DR2 meet with each other may be rounded to have a predefined curvature or may be formed at a right angle. The planar shape of the display device 10 is not limited to be rectangular, and may be other polygons, a circles, or an oval.

The display device 10 may include a flat first area DS1, a second area DS2 extending from each of left and right sides of the first area DS1, and a third area DS3 extending from each of upper and lower sides of the first area DS1. Each of the second area DS2 and the third area DS3 may be flat or curved. In an embodiment, where each of the second area DS2 and the third area DS3 is flat, each of an angle between the first area DS1 and the second area DS2 and an angle between the first area DS1 and the third area DS3 may be an obtuse angle. In an embodiment, where each of the second area DS2 and the third area DS3 is curved, each of the second area DS2 and the third area DS3 may have a constant curvature or have a varying curvature. The drawing shows an embodiment where the second area DS2 on each of the left and right sides of the area DS1 and the third area DS3 on each of the upper and lower sides of the area DS1 are curved with respect to the first area DS1 of the display device 10, but the disclosure is not limited thereto.

The cover window 100 may be disposed on the display panel 300 to cover a top face of the display panel 300. Thus, the cover window 100 may function to protect the top face of the display panel 300. The cover window 100 may be attached to the top face of the display panel 300 via an adhesive member. The cover window 100 may include or be made of glass, sapphire, and/or plastic. The cover window 100 may be rigid or flexible. The adhesive member may be embodied as an optically cleared adhesive film ("OCA"), or an optically cleared resin ("OCR").

The cover window 100 may include a light-transmission portion DA100 corresponding to a display area DA of the display panel 300, and a light-blocking portion NDA100 corresponding to non-display area NDA of the display panel 300 and an area of the display device 10 other than an area of the display panel 300. The light-transmission portion DA100 may be disposed in the first area DS1, and a portion of each of the second area DS2 and the third area DS3. The light-blocking portion NDA100 may be disposed out of the second area DS2 and the third area DS3 and may be opaque.

The cover window 100 may include a base substrate 110 and a printed layer 130 disposed on one face of the base substrate 110.

The base substrate 110 may include or be made of a transparent material. The base substrate 110 may include or be made of, for example, glass or plastic. In an embodiment, where the base substrate 110 includes the plastic, the base substrate 110 may have a flexible property.

In an embodiment, the plastic applicable to the base substrate 110 may include, but may not be limited to, at least one selected from polyimide, polyacrylate, polymethylmethacrylate ("PMMA"), polycarbonate ("PC"), polyethylenenaphthalate ("PEN"), polyvinylidene chloride, polyvinylidene fluoride polyvinylidene difluoride ("PVDF"), polystyrene, ethylene vinylalcohol copolymer, polyethersulphone ("PES"), polyetherimide ("PEI"), polyphenylene sulfide ("PPS"), polyallylate, tri-acetyl cellulose ("TAC"), and cellulose acetate propionate ("CAP"). A plastic window may include or be made of at least one of the above listed plastic materials. In an embodiment, where the base substrate 110 includes the plastic, a coating layer (not shown) may be disposed on top and bottom faces of the plastic. In an embodiment, the coating layer may include organic layer including an acrylate compound and/or a hard coating layer including an organic composite layer.

A planar shape of the base substrate 110 may be substantially the same as a planar shape of the display device 10 including the base substrate 110. In one embodiment, for example, where the display device 10 has a rectangular shape in a plan view, the base substrate 110 has a substantially rectangular shape in a plan view. In one alternative embodiment, for example, where the display device 10 is circular, the base substrate 110 may have a circular shape.

The base substrate 110 may be larger than the display panel 300 in a plan view, such that a side face thereof may protrude outwardly beyond a side face of the display panel 300. The base substrate 110 may protrude outwardly beyond each of sides of the display panel 300. Accordingly, when the cover window 100 and the display panel 300 are bonded to each other, the cover window 100 may cover outer side faces of the display panel 300.

The printed layer 130 may be disposed on one face of the base substrate 110, that is, a bottom face thereof facing toward the display panel 300. The printed layer 130 may be disposed on an edge of the base substrate 110 and may define the light-blocking portion NDA100 of the display device 10. The printed layer 130 may define a decorative layer that imparts an aesthetic feeling and/or an outermost black matrix layer.

The display panel 300 may be disposed on a bottom face of the cover window 100. The display panel 300 includes the display area DA that displays an image or a screen and the non-display area NDA that surrounds the display area DA. The display area DA of the display panel 300 may be disposed to overlap the light-transmission portion DA100 of the cover window 100, while the non-display area NDA may be disposed to overlap the light-blocking portion NDA100 of the cover window 100. That is, the display area DA may be disposed in the first area DS1, and a portion of each of the second area DS2 and the third area DS3, while the non-display area NDA may be disposed in a portion of each of the second area DS2 and the third area DS3. Accordingly, the image from the display panel 300 may be displayed not only from the first area DS1 but also from the second area DS2 and the third area DS3.

Although not shown in the drawing, a polarizing film may be attached between the display panel 300 and the cover window 100 to prevent deterioration of visibility due to reflection of external light. The polarizing film may include at least one selected from a 2/2 plate (half-wave plate) and a 214 plate (quarter-wave plate).

In an embodiment, the display panel 300 may include an organic light-emitting display panel, a micro light emitting diode ("LED") display panel, a nano LED display panel, a quantum dot light-emitting display panel, a liquid crystal display panel, a plasma display panel, a field emission display panel, an electrophoretic display panel, or an electricity wet display panel, for example. Hereinafter, for convenience of description, embodiments in which the display panel 300 is embodied as the organic light-emitting display panel will be described, but the disclosure is not limited thereto. In alternative embodiments, the display panel 300 may be embodied as other display panels, without departing from the teachings herein.

FIG. 3 is a plan view showing a display panel according to an embodiment. FIG. 4 is a cross-sectional view taken along line IV-IV' in FIG. 3.

Referring to FIG. 3 and FIG. 4, an embodiment of the display panel 300 may include a plurality of pixels PX. The plurality of pixels PX may be arranged in a matrix form. A shape of each pixel PX may be rectangular or square in a plan view, but is not limited thereto. Alternatively, the pixel may have a rhombus shape in which each side is inclined with respect to the first direction DR1. Each pixel PX may include a light-emitting area. Each light-emitting area may have the same shape as that of the pixel PX. Alternatively, each light-emitting area may have a shape different from that of the pixel PX. In one embodiment, for example, where the shape of the pixel PX is a rectangular shape, the shape of the light-emitting area of the pixel PX may have various shapes such as a rectangle, a rhombus, a hexagon, an octagon, and a circle.

According to an embodiment, the display panel 300 includes a plurality of bending lines BL1, BL2, BL3, and BL4. Each of sides of the display panel 300 may be curved from each of the bending lines BL1, BL2, BL3, and BL4 to form a curved face, but alternatively, may be bent at a right angle. That is, the display panel 300 may include the first area DS1 having a flat face as in the display device 10 or the cover window 100, and the second area DS2 and the third area DS3 which are curved areas respectively extending from the left and right sides and the upper and lower sides of the first area DS1. The first area DS1 may be a flat area located on one side of each of the bending lines BL1, BL2, BL3, and BL4, and each of the second area DS2 and the third area DS3 may be a curved area located on the opposite side of each of the bending lines BL1, BL2, BL3, and BL4.

An embodiment of the display panel 300 may include the first area DS1 as a flat area that is not curved from each of the plurality of bending lines BL1, BL2, BL3, and BL4, and the second area DS2 and the third area DS3 which are curved, for example, downwardly from the first area DS1. Each of the second area DS2 and the third area DS3 of the display panel 300 may have a curved face from each of the plurality of bending lines BL1, BL2, BL3, and BL4, or may be bent at a right angle from each of the plurality of bending lines BL1, BL2, BL3, and BL4. The first area DS1 may be surrounded with the plurality of bending lines BL1, BL2, BL3, and BL4 and have a flat face. The display panel 300 shown in FIG. 3 is in a state in which one side of the display panel 300 is not bent from each of the bending lines BL1, BL2, BL3, and BL4.

The first bending line BL1 may be located at the opposite side in the first direction DR1 of the display panel 300 and may extend along the second direction DR2. The second bending line BL2 may be positioned at one side in the first direction DR1 of the display panel 300 and may extend along the second direction DR2. The third bending line BL3 may be located at one side of the second direction DR2 of the display panel 300 and may extend along the first direction DR1. The fourth bending line BL4 may be located at the opposite side in the second direction DR2 of the display panel 300 and may extend along the first direction DR1. The first bending line BL1 and the second bending line BL2 may extend parallel to each other, while the third bending line BL3 and the fourth bending line BL4 may extend parallel to each other. The first bending line BL1 and the second bending line BL2 may intersect the third bending line BL3 and the fourth bending line BL4, respectively. In one embodiment, for example, the first bending line BL1 and the second bending line BL2 may extend in a perpendicular manner to the third bending line BL3 and the fourth bending line BL4, respectively. The disclosure is not limited thereto.

The bending lines BL1, BL2, BL3, and BL4 may intersect each other to define intersection points. In one embodiment, for example, the first bending line BL1 and the third bending line BL3 may intersect each other at a first bending intersection point DBP1 adjacent to a corner defined by the opposite side in the first direction DR1 of the display panel 300 and one side in the second direction DR2 thereof. The second bending line BL2 and the third bending line BL3 may intersect each other at a second bending intersection point DBP2 adjacent to a corner defined between one side in the first direction DR1 and one side in the second direction DR2 of the display panel 300. Further, the first bending line BL1 and the fourth bending line BL4 may intersect each other at a third bending intersection point DBP3 adjacent to a corner defined between the opposite side in the first direction DR1 of the display panel 300 and the opposite side in the second direction DR2 thereof. The second bending line BL2 and the fourth bending line BL4 may intersect each other at a fourth bending intersection point DBP4 adjacent to a corner defined by one side in the first direction DR1 of the display panel 300 and the opposite side in the second direction DR2 of the display panel 300 thereof.

According to an embodiment, the bending intersection points DBP1, DBP2, DBP3, DBP4 may be located in the display panel 300. The bending intersection points DBP1, DBP2, DBP3, and DBP4 may be located at a boundary between the display area DA and the non-display area NDA of the display panel 300. The disclosure is not limited thereto. In an alternative embodiment, the bending intersection points DBP1, DBP2, DBP3, and DBP4 may be located within the display area DA or the non-display area NDA.

Each of the bending lines BL1, BL2, BL3, and BL4 may divide each of the display area DA and the non-display area NDA into a plurality of sub-areas. The bending lines BL1, BL2, BL3, and BL4 may divide the display area DA into a first display area DA1 to a fifth display area DA5. The bending lines BL1, BL2, BL3, and BL4 may divide the non-display area NDA into a first non-display area NDA1 to an eighth non-display area NDA8. The fifth display area DA5 may be located in the flat first area DS1 of the display panel 300. The first to fourth display areas DA1, DA2, DA3, and DA4 may be located in the second area DS2 and the third area DS3. The first to eighth non-display areas NDA1, NDA2, NDA3, NDA4, NDA5, NDA6, NDA7, and NDA8 may be located in the second area DS2 and the third area DS3.

The fifth display area DA5 may be surrounded with the bending lines BL1, BL2, BL3, and BL4 and may be located in an inner region of the display panel 300. The first display area DA1 may be located at the left side around the first bending line BL1, and may be located adjacent to the fifth display area DA5 while the first bending line BL1 may define a boundary therebetween. The second display area DA2 may be located at the right side around the second bending line BL2, and may be located adjacent to the fifth display area DA5 while the second bending line BL2 may define a boundary therebetween. The third display area DA3 may be located at the upper side around the third bending line BL3 and adjacent to the fifth display area DA5 while the third bending line BL3 may define a boundary therebetween. The fourth display area DA4 may be located at the lower side around the fourth bending line BL4, and may be located adjacent to the fifth display area DA5 while the fourth bending line BL4 may define a boundary therebetween.

The first to fourth non-display areas NDA1, NDA2, NDA3, and NDA4 are located at the upper, lower, and left and right sides of the display panel 300, and the fifth to eighth non-display areas NDA5, NDA6, NDA7, and NDA8 are located at the curved corners of the display panel 300.

The first non-display area NDA1 may be positioned on the opposite side in the first direction DR1 of the first display area DA1 and may be spaced apart from the fifth display area DA5 while the first display area DA1 may be interposed therebetween. The second non-display area NDA2 may be positioned on one side in the first direction DR1 of the second display area DA2 and may be spaced apart from the fifth display area DA5 while the second display area DA2 may be interposed therebetween. Further, the third non-display area NDA3 may be located on one side in the second direction DR2 of the third display area DA3 and may be spaced apart from the fifth display area DA5 while the third display area DA3 may be interposed therebetween. The fourth non-display area NDA4 may be located on the opposite side in the second direction DR2 of the fourth display area DA4 and may be spaced apart from the fifth display area DA5 while the fourth display area DA4 may be interposed therebetween.

The fifth non-display area NDA5 may be located at a left-upper corner of the display panel 300 where the first non-display area NDA1 and the third non-display area NDA3 meet each other. The sixth non-display area NDA6 may be located at a right-upper corner of the display panel 300 where the third non-display area NDA3 and the second where the non-display area NDA2 meet each other. The seventh non-display area NDA7 may be located at a left-lower corner of the display panel 300 where the first non-display area NDA1 and the fourth non-display area NDA4 meet with each other. The eighth non-display area NDA8 is located at a right-lower corner of the display panel 300 where the fourth non-display area NDA4 and the second non-display area NDA2 meet with each other.

In one embodiment, for example, as described above, the display device 10 may include the flat first area DS1, the curved or bent second area DS2 and the curved or bent third area DS3. Each of the cover window 100 and the display panel 300 of the display device 10 may include a flat area corresponding to the first area DS1, a curved area corresponding to the second area DS2, and a curved area corresponding to the third area DS3 of the display device 10. The display panel 300 may include the fifth display area DA5 that is surrounded with the first to fourth bending lines BL1, BL2, BL3, and BL4 and is flat and corresponds to the first area DS1 of the display device 10. The display panel 300 may include other non-display areas NDA, the first and second display areas DA1 and DA2 corresponding to the second area DS2, and the third and fourth display areas DA3 and DA4 corresponding to the third area DS3. The first and second display areas DA1 and DA2 and the third and fourth display areas DA3 and DA4 may be bent downward to be curved from the first area DS1 or the fifth display DA5 and along the first to fourth bending lines BL1, BL2, BL3, and BL4, respectively.

The display panel 300 may be manufactured in a state where an entire upper surface is in a flat state. Then, each side portion may be bent to have a predefined curvature along each of the first to fourth bending lines BL1, BL2, BL3, and BL4. Then, the display panel 300 may be interconnected with the cover window 100. Thus, the display device may be manufactured. An embodiment of the display panel 300 includes a plurality of alignment marks 200 to measure a bent degree of each side of the display panel 300 and an alignment state thereof with the cover window 100. In a bonding process between the display panel 300 and the cover window 100, the alignment marks 200 may be used to measure change in a planar size of the display panel 300 as each of the sides of the display panel 300 is bent and then to calculate the bent degree thereof based on the measurement.

An embodiment of the display panel 300 may include a plurality of alignment marks 200 disposed in the first area DS1 as a flat area and the second area DS2 or the third area DS3 as a curved area which may be distinguished from each other based on the bending lines BL1, BL2, BL3, and BL4. The alignment mark 200 may include a first alignment mark 210 disposed in the first area DS1 and a second alignment mark 220 disposed in the second area DS2 which may be distinguished from each other based on the first bending line BL1. Further, the alignment mark 200 may include a third alignment mark 230 disposed in the first area DS1 and a fourth alignment mark 240 disposed in the third area DS3 which may be distinguished from each other based on the third bending line BL3.

Each of the first to fourth alignment marks 210 and 220, 230 and 240 may be disposed in display area DA. The first alignment mark 210 and the third alignment mark 230 may be disposed in the first area DS1 which is flat and may extend inwardly from the first and third bending lines BL1 and BL3, respectively. The second alignment mark 220 and the fourth alignment mark 240 may be respectively disposed in the second area DS2 and the third area DS3 which are curved.

A plurality of first alignment marks 210 and a plurality of third alignment marks 230 may be disposed in the fifth display area DA5 corresponding to the first area DS1. A plurality of second alignment marks 220 and a plurality of fourth alignment marks 240 may be respectively disposed in the first to the fourth display areas DA1, DA2, DA3, and DA4 corresponding to the second area DS2 and the third area DS3. At least one alignment mark 200 may be disposed at each side of the display panel 300 and correspond to each of the bending lines BL1, BL2, BL3, and BL4. In the drawing, two first alignment marks 210 and two second alignment marks 220 are disposed at each of left and right sides of the display panel 300, while two third alignment marks 230 and two fourth alignment marks 240 are disposed at each of upper and lower sides of the display panel 300. Thus, a total of 16 alignment marks 200 are arranged on an entire face of the display panel 300. However, the disclosure is not limited thereto. In an alternative embodiment, a lee or greater number of the alignment marks 200 may be disposed on the display panel 300. The alignment mark 200 disposed in the display panel 300 will be described later in greater detail with reference to other drawings.

In one embodiment, for example, although not shown, a pad area for receiving an external signal may be further disposed on a lower short-side of the display panel 300. The pad area may be located at the opposite side in the second direction DR2 of the non-display area NDA4 located at the lower short-side of the display panel 300. In the pad area, signal lines extending from the display area DA may be disposed. The signal lines may be electrically connected to external signal terminals, for example, a lead line of a printed circuit board when a chip on film is applied, or bumps of a driver chip when a chip on plastic is applied.

The display panel 300 may include a substrate 101, a thin-film transistor layer TFTL, a light-emissive element layer EML, and a thin-film encapsulation layer TFEL and a touch sensor layer TSP disposed on the substrate 101 as shown in FIG. 4.

The substrate 101 may be a rigid substrate or a flexible substrate capable of being bent, foldable, rollable, or the like. The substrate 101 may include or be made of an insulating material such as glass, quartz, or polymer resin. In an embodiment, polymer resin may include PES, polyacrylate ("PA"), polyarylate ("PAR"), PEI, PEN, polyethyleneterephtalate ("PET"), PPS, polyallylate, polyimide ("PI"), PC, cellulosetriacetate ("CAT"), CAP, or a combination thereof. The substrate 101 may include a metal material.

The thin-film transistor layer TFTL may be disposed on the substrate 101. In an embodiment, not only thin-film transistors for each pixel, but also scan lines, data lines, power lines, scan control lines, and link lines for connecting pads and the data lines to each other may be disposed in the thin-film transistor layer TFTL. Each of the thin-film transistors may include a gate electrode, a semiconductor layer, a source electrode, and a drain electrode.

The thin-film transistor layer TFTL may be disposed in the display area DA and the non-display area NDA. In an embodiment, the thin-film transistors for each of the pixels, the scan lines, the data lines, and the power lines of the thin-film transistor layer TFTL may be disposed in the display area DA. The scan control lines and the link lines of the thin-film transistor layer TFTL may be disposed in the non-display area NDA.

The light-emissive element layer EML may be disposed on the thin-film transistor layer TFTL. The light-emissive element layer EML may include pixels, each of which includes a first electrode, a light-emissive layer, and a second electrode, and may include a pixel defining layer defining the pixels. The light-emissive layer may be embodied as an organic light-emissive layer including an organic material. In such an embodiment, the light-emissive layer may include a hole transporting layer, an organic light-emissive layer, and an electron transporting layer. When a predefined voltage may be applied to the first electrode via the thin-film transistor of the thin-film transistor layer TFTL and a cathode voltage is applied to the second electrode, holes and electrons move to the organic light-emissive layer through the hole transport layer and the electron transport layer, respectively, and then combine with each other in the organic light-emissive layer to emit light. The pixels of the light-emissive element layer EML may be disposed in the display area DA.

The thin-film encapsulation layer TFEL may be disposed on the light-emissive element layer EML. The thin-film encapsulation layer TFEL serves to prevent invasion of oxygen or moisture into the light-emissive element layer EML. To this end, the thin-film encapsulation layer TFEL may include at least one inorganic film. The inorganic film may include, but may not be limited to, a silicon nitride layer, a silicon oxynitride layer, a silicon oxide layer, a titanium oxide layer, or an aluminum oxide layer. In an embodiment, the thin-film encapsulation layer TFEL serves to protect the light-emissive element layer EML from foreign materials, such as dusts. In such an embodiment, the thin-film encapsulation layer TFEL may include at least one organic film. The organic film may include or be made of at least one selected from an acryl resin, an epoxy resin, a phenolic resin, a polyimide resin, and the like. However, the disclosure is not limited thereto.

The thin-film encapsulation layer TFEL may be disposed in both the display area DA and the non-display area NDA. In an embodiment, the thin-film encapsulation layer TFEL may be disposed to cover the light-emissive element layer EML in each of the display area DA and the non-display area NDA, and to cover the thin-film transistor layer TFTL in the non-display area NDA.

The touch sensor layer TSP may be disposed on the thin-film encapsulation layer TFEL. In an embodiment, the touch sensor layer TSP may be directly on the thin-film encapsulation layer TFEL to allow a thickness of the display device 10 to be reduced, compared to a case where a separate touch panel including a touch sensor layer TSP is attached on the thin-film encapsulation layer TFEL.

The touch sensor layer TSP may include touch electrodes for detecting a user's touch in a capacitive manner and touch lines for connecting the pads and the touch electrodes to each other. In one embodiment, for example, the touch sensor layer TSP may detect a user's touch using a self-capacitance scheme or a mutual capacitance scheme.

A cover window may be additionally disposed on the touch sensor layer TSP. In an embodiment, the touch sensor layer TSP and the cover window may be attached to each other via a transparent adhesive member.

In one embodiment, for example, the display device 10 may include the plurality of alignment marks 200 disposed in the display panel 300. The alignment marks 200 may be disposed between the thin-film transistor layer TFTL and the light-emissive element layer EML, but the disclosure is not limited thereto. The alignment marks 200 may be disposed on the light-emissive element layer EML or the thin-film encapsulation layer TFEL. As shown in the drawing, the alignment marks 200 may include the first alignment mark 210 disposed in the fifth display area DA5 corresponding to the first area DS1 of the display area DA, and the second alignment mark 220 disposed in each of the first display area DA1 and the second display area DA2 corresponding to the second area DS2. In an embodiment, the alignment mark 200 may include a plurality of stacked conductive patterns. However, the disclosure is not limited thereto.

As described above, an embodiment of the display device 10 includes the flat face first area DS1 and the curved or bent second area DS2 and third area DS3. In such an embodiment, the display device 10 may be manufactured by bending each of the sides of the display panel 300 to have a predefined curvature, and performing a process of bonding the display panel 300 to the cover window 100. An embodiment of the display device 10 may include the alignment mark 200 disposed in the display panel 300 which may be used to calculate a bent degree of each of the sides of the display panel 300, and to measure an alignment state between the display panel 300 and the cover window 100 in a bonding process between the display panel 300 and the cover window 100. Hereinafter, the alignment mark 200 disposed in the display panel 300 will be described in detail with reference to other drawings.

Figure 9:
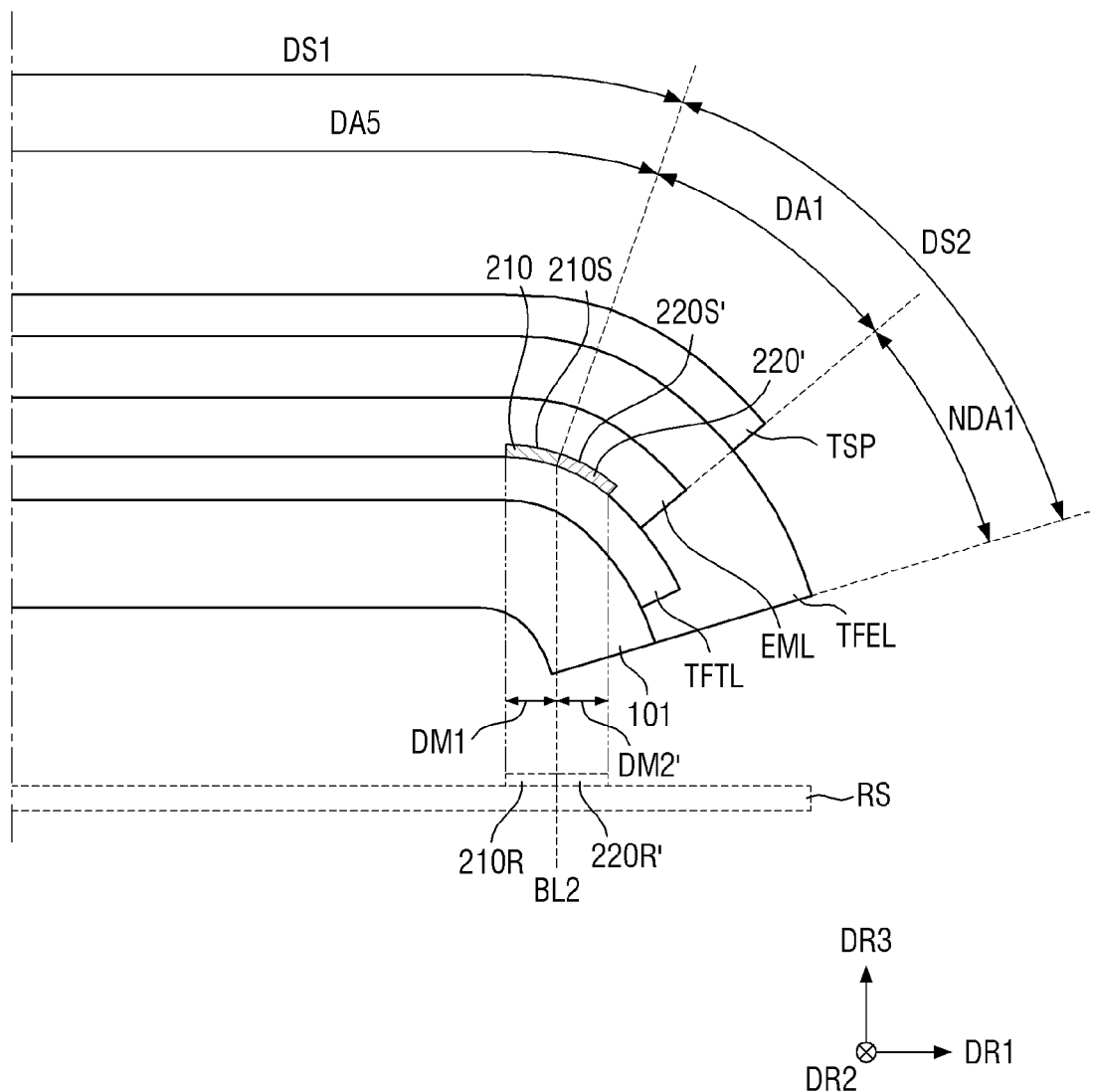
FIG. 9 is a cross-sectional view taken along line IX-IX' in FIG. 8.

FIG. 5 is a schematic diagram showing a Q1 portion when the display panel of FIG. 3 is in a non-bent state. FIG. 6 is a cross-sectional view taken along line VI-VI' in FIG. 5. FIG. 7 is a plan view showing a Q2 portion of FIG. 5. FIG. 8 is a schematic diagram showing a Q1 portion when the display panel of FIG. 3 is in a bent state. FIG. 9 is a cross-sectional view taken along line IX-IX' in FIG. 8. FIG. 10 is a plan view showing a Q3 portion of FIG. 9.

FIG. 5 is an enlarged view of a left-upper corner where the first bending intersection point DBP1 where the first bending line BL1 and the third bending line BL3 intersect with each other is located when the display panel 300 is in the non-bent state. FIG. 8 is an enlarged view of the left-upper corner where the first bending intersection point DBP1 where the first bending line BL1 and the third bending line BL3 intersect with each other is located when the display panel 300 is in the bent state. In an embodiment, the alignment marks 200 disposed in the display panel 300 have substantially the same structure or shape as each other except for positions thereof. In such an embodiment, the first alignment mark 210 and the second alignment mark 220 facing toward each other while the first bending line BL1 is interposed therebetween are substantially the same as the third alignment mark 230 and the fourth alignment mark 240 facing toward each other while the third bending line BL3 is interposed therebetween. Hereinafter, the first alignment mark 210 and the second alignment mark 220 facing toward each other while the first bending line BL1 is interposed therebetween will be described in detail, and any repetitive detailed description of the first alignment marks 210 and the second alignment mark 220 facing toward each other while another bending line BL is interposed therebetween will be omitted.

Referring to FIG. 5 to FIG. 10, an embodiment of the display panel 300 may include the first bending line BL1 extending in one direction, for example, the second direction DR2, and located in the display area DA. The display panel 300 may include the first alignment mark 210 disposed in the first area DS1 or the fifth display area DA5 as one side area around the first bending line BL1, and the second alignment mark 220 disposed in the second area DS2 or the first display area DA1 as the opposite side area around the first bending line BL1.

The first alignment mark 210 and the second alignment mark 220 may face toward each other while the first bending line BL1 is interposed therebetween. In an embodiment, the one side portion and the opposite side portion, that is, a first side portion corresponding to the first alignment mark 210 and the second side portion corresponding to the second alignment mark 220 may contact each other while the first bending line BL1 is interposed therebetween.

The second area DS2 of the display panel 300 may be bent downward in the opposite direction to the third direction DR3 relative to the flat first area DS1 which is not bent from the first bending line BL1. Accordingly, the first alignment mark 210 among the first alignment mark 210 and the second alignment mark 220 facing toward each other while the first bending line BL1 is interposed therebetween may not be bent, while the second alignment mark 220 may be bent relative to the first alignment mark 210. In a top-down view or a top plan view in the opposite direction to the third direction DR3 of the display panel 300 in the non-bent state, a first area of the first alignment mark 210 and a second area of the second alignment mark 220 disposed on a flat face are visually recognized as a non-deformed state. However, when the second area DS2 of the display panel 300 is bent from the first bending line BL1, the second alignment mark 220 may be recognized as having a narrower area due to a perspective effective as the mark 220 extends from the first bending line BL1 toward the opposite side portion spaced apart from the first bending line BL1. In an embodiment, when the display panel 300 is bent at the first bending line BL1, a degree to which the display panel 300 is bent may be calculated based on a measuring result of change in the second area of the second alignment mark 220 disposed in the second area DS2 as the bent area. In an alternative embodiment, when the display panel 300 is bent, the bent degree of the display panel 300 may be determined based on a comparing result of the first area of the second alignment mark 220 with the second area of the first alignment mark 210.

According to an embodiment, the first area 210S of the first alignment mark 210 may be different from the second area 220S of the second alignment mark 220. In one embodiment, for example, as shown in FIG. 5 to FIG. 7, when the display panel 300 is in a non-bent state, the second area 220S of the second alignment mark 220 may be larger than the first area 210S of the first alignment mark 210.

The first alignment mark 210 may have a first first-directional dimension DM1 measured in the first direction DR1 and a first second-directional dimension H1 measured in the second direction DR2. The second alignment mark 220 may have a second first-directional dimension DM2 measured in the first direction DR1 and a second second-directional dimension H2 measured in the second direction DR2. When the first display area DA1 corresponding to the second area DS2 is bent from the first bending line BL1, the first alignment mark 210 may be recognized as having the same area as that before the first display area DA1 is bent, while the second alignment mark 220 may be recognized as having an area smaller than that before the first display area DA1 is bent, due to a perspective effect. According to an embodiment, the second area 220S of the second alignment mark 220 may be larger than the first area 210S of the first alignment mark 210. That is, at least one of the second first-directional dimension DM2 and the second second-directional dimension H2 may be larger than at least one of the first first-directional dimension DM1 and the first second-directional dimension H1.

In an embodiment, the second alignment mark 220 has the first-directional dimension DM2 measured in the first direction DR1 perpendicular to the second direction DR2 in which the bending line, that is, the first bending line BL1 extends. The first-directional dimension DM2 may be greater than the first-directional dimension DM1 measured in the second direction DR2 of the first alignment mark 210. FIG. 7 shows that the first second-directional dimension H1 is equal to the second second-directional dimension H2, while the second first-directional dimension DM2 is larger than the first first-directional dimension DM1. In an embodiment, each of the first alignment mark 210 and the second alignment mark 220 may have a tapered shape in which a width decreases as it extends toward the first bending line BL1. Tips of the first alignment mark 210 and the second alignment mark 220 may contact each other at the first bending line BL1. That is, each of the first alignment mark 210 and the second alignment mark 220 may have a tapered shape in which a width decreases as it extends toward the first bending line BL1, while the tip of the first alignment mark 210 and the tip of the second alignment mark 220 may contact each other at the first bending line BL1. However, the disclosure is not limited thereto. The shape of each of the first alignment mark 210 and the second alignment mark 220 is not particularly limited.

When the first display area DA1 as the second area DS2 is bent downwards, that is, in the opposite direction to the third direction DR3 and from the first bending line BL1 extending in the second direction DR2, a perspective effect in a region in the first display area DA1 may increase as a spacing between the region in the first display area DA1 and the first bending line BL1 in the second direction DR2 increases. When the second alignment mark 220 located in the curved area is viewed in the opposite direction to the third direction DR3, the second first-directional dimension DM2 extending in the first direction DR1 may be smaller due to the perspective effect. Accordingly, although the second alignment mark 220 has an area larger than that of the first alignment mark 210, the first alignment mark 210 and the second alignment mark 220 may be recognized as having substantially the same area as each other when viewed in the opposite direction to the third direction DR3 in a state where the display panel 300 is bent.

In an embodiment, the first area DS1 of the display panel 300 may be a flat face which is not curved. In such an embodiment, as shown in FIG. 6, an imaginary reference surface RS having a plane parallel to the flat first area DS1 and spaced apart from the first area DS1 in the third direction DR3 may be defined. In a top-down view of the first alignment mark 210 and the second alignment mark 220 in the opposite direction to the third direction DR3 of the display panel 300, each of the first alignment mark 210 and the second alignment mark 220 may be projected on the reference surface RS such that an orthogonal projection area may be defined thereon. A first orthogonal projection area 210R corresponding to the first alignment mark 210 in the opposite direction to the third direction DR3 may be defined on the reference surface RS. A second orthogonal projection area 220R corresponding to the second alignment mark 220 in the opposite direction to the third direction DR3 may be defined on the reference surface RS. In the non-bent state of the display panel 300, the first orthogonal projection area 210R may be smaller than the second orthogonal projection area 220R because the second area 220S of the second alignment mark 220 may be larger than the first area 210S of the first alignment mark 210.

In such an embodiment, as shown in FIG. 8 to FIG. 10, when the second area DS2 of the display panel 300 is bent downward from the first bending line BL1 and relative to the first area DS1, the first alignment mark 210 disposed in the flat first area DS1 may not be bent, while the second alignment mark 220' disposed in the second area DS2 as the curved area may be bent downwards. Thus, a spacing in the first direction DR1 between a region in the second area DS2 and the first bending line BL1 extending in the second direction DR2 may be perceived as being smaller, due to the perspective effect, as the region in the second area DS2 is far away, in the first direction DR1, from the first bending line BL1 extending in the second direction DR2. That is, a second first-directional dimension DM2' in the first direction DR1 of the second alignment mark 220' may be reduced when viewed in the opposite direction to the third direction DR3.

The first area 210S of the first alignment mark 210 may have substantially the same size as that of the first orthogonal projection area 210R even when the display panel 300 is bent. In such an embodiment, as the display panel 300 is bent, that is, as the second area DS2 is bent, the second area 220S' of the second alignment mark 220' may be constant, while the second orthogonal projection area 220R' may become smaller.

According to an embodiment, in the state in which the display panel 300 is bent, the first orthogonal projection area 210R of the first alignment mark 210 and the second orthogonal projection area 220R' of the second alignment mark 220' may be equal to each other. FIG. 10 is a top-down view of an orthogonal projection area of the Q3 portion of FIG. 8 in the opposite direction to the third direction DR3.

As shown in FIG. 7 and FIG. 10, each of the first first-directional dimension DM1 and the first second-directional dimension H1 of the first alignment mark 210 of the first area DS1 may be constant even when the display panel 300 is bent. In such an embodiment, as the second area DS2 is bent, the second first-directional dimension DM2' of the second alignment mark 220 of the second area DS2 in the first direction DR1 perpendicular to the second direction DR2 where the first bending line BL1 extends and the second second-directional dimension H2' may become narrower due to the perspective effect. Accordingly, the second orthogonal projection area 220R' of the second alignment mark 220 as viewed in the opposite direction to the third direction DR3 may have the same size as the first orthogonal projection area 210R of the first alignment mark 210 as viewed in the opposite direction to the third direction DR3.

During the manufacturing process of the display device 10, when the second area DS2 of the display panel 300 is bent, the bent degree of the display panel 300 may be calculated based on the measuring result of the change in the size of the second orthogonal projection area 220R of the second alignment mark 220. In an embodiment, the first alignment mark 210 and the second alignment mark 220 may be designed in a way such that the first area 210S of the first alignment mark 210 is smaller than the second area 220S of the second alignment mark 220, and the first orthogonal projection area 210R has the same size as that of the second orthogonal projection area 220R when the display panel 300 is bent. Accordingly, in the manufacturing process of the display device 10, the second area DS2 of the display panel 300 is bent until the size of the second orthogonal projection area 220R' is equal to that of the first orthogonal projection area 210R, and then, the display panel 300 and the cover window 100 may be interconnected to or combined with each other.

FIG. 11 is a cross-sectional view schematically showing a curved area of a display device according to an embodiment.

Referring to FIG. 11, an embodiment of the display device 10 may include the fifth display area DA5 located in the flat first area DS1, the first display area DA1 and the first non-display area NDA1 located in the second area DS2 as the curved area. The cover window 100 includes the base substrate 110 and the printed layer 130. The printed layer 130 may be disposed in an area corresponding to the first non-display area NDA1 of the display panel 300 to define the light-blocking portion (NDA100 in FIG. 2) of the display device 10.

The display panel 300 includes the first alignment mark 210 and the second alignment mark 220 facing toward each other while the first bending line BL1 is interposed therebetween. The first alignment mark 210 may be disposed in the fifth display area DA5 corresponding to the first area DS1, while the second alignment mark 220 may be disposed in the first display area DA1 which is located in the second area DS2. When the display panel 300 is bent along the first bending line BL1, the first orthogonal projection area 210R of the first alignment mark 210 and the second orthogonal projection area 220R' of the second alignment mark 220 may have the same size as each other. The second alignment mark 220 of the display panel 300 may be designed in a way such that the second orthogonal projection area 220R' of the second alignment mark 220 may have the same size as that of the first orthogonal projection area 210R of the first alignment mark 210 when the display panel 300 is bent at a preset bent angle. Alternatively, in the method for manufacturing the display device 10, the bent angle of the display panel 300 may be measured based on the change in the size of the second orthogonal projection area 220R of the second alignment mark 220.

FIG. 12 is a flowchart showing a method for manufacturing a display device according to an embodiment.

Referring to FIG. 12, an embodiment of the method for manufacturing the display device 10 includes preparing a display panel 300 including the first bending line BL1 extending in the first direction DR1 or the second direction DR2, the first alignment mark 210 disposed at one side around the first bending line BL1, and the second alignment mark 220 disposed at the opposite side around the first bending line BL1 and facing toward the first alignment mark 210 (S100), bending the opposite side around the first bending line BL1 of the display panel 300, that is, bending the second area DS2, in the opposite direction to the third direction DR3 perpendicular to the first direction DR1 or the second direction DR2 (S200), and bonding the cover window 100 to the display panel 300 to cover the display panel 300 (S300).

The method for manufacturing the display device 10 may include bonding the display panel 300 to the cover window 100 while the display panel is in a bent state. As described above, the size of the second orthogonal projection area 220R of the second alignment mark 220 of the display panel 300 may vary as the second area DS2 is bent. In an embodiment, the bending of the display panel 300 may include comparing the first orthogonal projection area 210R of the first alignment mark 210 with the second orthogonal projection area 220R of the second alignment mark 220. The bent angle of the display panel 300 may be calculated based on the measuring result of the change in the size of the second orthogonal projection area 220R of the second alignment mark 220. The method will be described in detail with reference to other drawings.

FIG. 13 to FIG. 15 are cross-sectional views showing a method for manufacturing a display device according to an embodiment.

First, referring to FIG. 13, the method may prepare the display panel 300 including the first alignment mark 210 and the second alignment mark 220. The display panel 300 includes the first bending line BL1 and the second bending line BL2, and may include the first area DS1 as a flat area therebetween, and the second area DS2 as a curved area other than the first area DS1. The first area DS1 includes the fifth display area DA5, and the second area DS2 includes the first display area DA1 and the first non-display area NDA1, or the second display area DA2 and the second non-display area NDA2. Since the display panel 300 is the same as that described above, any repetitive detailed description thereof will be omitted. Further, hereinafter, a method for manufacturing the display device 10 will be described based on the first bending line BL1 of the display panel 300. Descriptions based on the first bending line BL1 to be made below may be equally applied to the second bending line BL2 or each of the third and fourth bending lines BL3 and BL4 which are not shown in the drawings.

FIG. 13 shows the orthogonal projection areas 210R and 220R of the first alignment mark 210 and the second alignment mark 220 before the display panel 300 is bent. The first orthogonal projection area 210R and the second orthogonal projection area 220R before the display panel 300 is bent have the same sizes as those of the first area 210S of the first alignment mark 210 and the second area 220S of the second alignment mark 220, respectively. According to an embodiment, the second area 220S of the second alignment mark 220 is larger than the first area 210S of the first alignment mark 210. Thus, in FIG. 13, the second orthogonal projection area 220R may be larger than the first orthogonal projection area 210R.

Next, referring to FIG. 14, the method may include bending the display panel 300. In an embodiment, the second area DS2 as the opposite side around the first bending line BL1 may be bent downwardly. When the second area DS2 is bent, the size of the first orthogonal projection area 210R of the first alignment mark 210 disposed in the first area DS1 may not change, while the size of the second orthogonal projection area 220R of the second alignment mark 220 disposed in the second area DS2 may change. According to an embodiment, the bending of the display panel 300 includes measuring the first orthogonal projection area 210R of the first alignment mark 210 and the second orthogonal projection area 220R of the second alignment mark 220, and comparing the first orthogonal projection area 210R and the second alignment mark 220 with each other.

As described above, the first alignment mark 210 and the second alignment mark 220 may be designed in a way such that the second area 220S of the second alignment mark 220 of the display panel 300 may be larger than the first area 210S of the first alignment mark 210. A ratio of the first area 210S to the second area 220S may be designed based on the bent angle of the display panel 300. In a process of bending the display panel 300, the bent angle of the display panel 300 may be calculated based on a measuring result of the change in the size of the second orthogonal projection area 220R' of the second alignment mark 220. In an embodiment, when the display panel 300 is in a bent state, the size of the second orthogonal projection area 220R' of the second alignment mark 220 may be the same as the size of the first orthogonal projection area 210R of the first alignment mark 210.

The second alignment mark 220 of the display panel 300 may be designed so that when the display panel is bent by a preset bent angle, the second orthogonal projection area 220R' of the display panel 300 has the same size as that of the first orthogonal projection area 210R of the first alignment mark 210. The bending of the display panel 300 as shown in FIG. 14 may include bending the display panel 300 until a size of the second orthogonal projection area 220R' becomes equal to a size of the first orthogonal projection area 210R.

Next, referring to 15, the method may bond the cover window 100 to the bent display panel 300. In a process of bonding the cover window 100, the first alignment mark 210 and the second alignment mark 220 may be used to measure an alignment state between the cover window 100 and the display panel 300. Like the display panel 300, the cover window 100 may include the flat area first area DS1 and the curved area second area DS2. When bonding the display panel 300 and the cover window 100 to each other, the method may measure a position and a size of the second alignment mark 220 of the display panel 300, calculate the bent angle of the display panel 300 based on the measured position and size, align the display panel with the cover window 100 based on the bent angle, and then bond the display panel to the cover window 100. Using the above method, an embodiment of the display device 10 may be manufactured. In an embodiment, the display device 10 includes the second alignment mark 220 having an area different from that of the first alignment mark 210. In such an embodiment, the method for manufacturing the display device 10 may include measure the bent angle of the display panel 300 using the first alignment mark 210 and the second alignment mark 220 and align the cover window 100 with the display panel 300 based on the bent angle.

In one embodiment, for example, as described above, the shapes of the first alignment mark 210 and the second alignment mark 220 are not limited to those shown in FIG. 5 to FIG. 10. Hereinafter, an alternative embodiment of the display device 10 will be described.

FIG. 16 and FIG. 17 are plan views showing a first alignment mark and a second alignment mark according to an alternative embodiment.

Referring to FIG. 16, in an embodiment of a display panel 300_1, a second-directional dimension of each of side portions of a first alignment mark 210_1 and a second alignment mark 220_1 contacting each other may be larger than a second-directional dimension of each of opposite side portions of the first alignment mark 210_1 and the second alignment mark 220_1 as spaced from each other. Each of the alignment marks 210_1 and 220_1 in FIG. 16 is the same as each of the alignment marks 210 and 220 in FIG. 7, except for a shape in a plan view. Hereinafter, differences therebetween will be described in detail.

The first alignment mark 210_1 and the second alignment mark 220_1 of FIG. 16 may be designed in a way such that the second-directional dimension of each of side portions of the first alignment mark 210_1 and the second alignment mark 220_1 contacting each other at and along the first bending line BL1 may be larger than the second-directional dimension of each of opposite side portions of the first alignment mark 210_1 and the second alignment mark 220_1 as spaced from each other. In such an embodiment, the second-directional dimension at a position in each of the first alignment mark 210_1 and the second alignment mark 220_1 may decrease as a spacing between the position and the first bending line BL1 increases.

In an embodiment, as shown in FIG. 16, a first second-directional dimension H1_1 of the first alignment mark 210_1 and a second second-directional dimension H2_1 of the second alignment mark 220_1 may be equal to each other, while a first first-directional dimension DM1_1 of the first alignment mark 210_1 may be smaller than a second first-directional dimension DM2_1 of the second alignment mark 220_1. In an embodiment, as long as the first alignment mark 210_1 and the second alignment mark 220_1 have different areas from each other, shapes thereof are not particularly limited. As long as the second-directional dimensions H1_1 and H2_1 of the first alignment mark 210_1 and the second alignment mark 220_1 measured in the second direction DR2 in which the first bending line BL1 of extends are equal to each other, while the first first-directional dimension DM1_1 and the second first-directional dimension DM2_1 thereof measured in the first direction DR1 perpendicular to the second direction DR2 are different from each other, the shapes of the first alignment mark 210_1 and the second alignment mark 220_1 are not limited thereto.

In one alternative embodiment, for example, referring to FIG. 17, second-directional dimensions H1_2, H2_2 of a first alignment mark 210_2 and a second alignment mark 220_2 as measured in the second direction DR2 in which the first bending line BL1 extends may be different from each other. In such an embodiment, first-directional dimensions DM1_2 and DM2_2 thereof measured in the first direction DR1 perpendicular to the second direction DR2 may be different from each other.

As described above, shapes of the first alignment mark 210_2 and the second alignment mark 220_2 are not particularly limited as long as the first alignment mark 210_2 and the second alignment mark 220_2 have different areas from each other. The first first-directional dimension DM1_2 and the second first-directional dimension DM2_2 respectively measured in the first direction DR1 of the first alignment mark 210_2 and the second alignment mark 220_2 in FIG. 17 may be different from each other. Further, the first second-directional dimension H1_2 and the second second-directional dimension H2_2 respectively measured in the second direction DR2 of the first alignment mark 210_2 and the second alignment mark 220_2 in FIG. 17 may be different from each other. The disclosure is not limited thereto.

FIG. 18 is a plan view showing alignment marks according to another alternative embodiment.

Referring to FIG. 18, according to an embodiment, an alignment mark 200_3, may include a first alignment mark 210_3 and a second alignment mark 220_3, and may further include at least one fifth alignment mark 251_3 and 252_3. The at least one fifth alignment mark 251_3 and 252_3 may be spaced apart from the first alignment mark 210_3 while the first bending line BL1 is interposed therebetween, and may be disposed in the second area DS2, and may have a third area larger than a second area 220S of the second alignment mark 220_3. In such an embodiment, the alignment mark 200_3 may include a plurality of alignment marks disposed in the second area DS2 as the curved area. The alignment marks 200_3 in FIG. 18 may be identical with the first alignment mark 210 and the second alignment mark 220 in FIG. 7, except that the alignment marks 200_3 in FIG. 18 further includes the fifth alignment marks 251_3 and 252_3. In such an embodiment, the first alignment mark 210_3 may have a first first-directional dimension DM1_3 measured in the first direction DR1 and a first second-directional dimension H1_3 measured in the second direction DR2, as described above with reference to FIG. 7. Hereinafter, differences therebetween will be described.

The display panel 300 may further include a plurality of fifth alignment marks 251_3 and 252_3 other than the second alignment mark 220_3 as alignment marks disposed in the second area DS2. Although the drawing shows that a first fifth alignment mark 251_3 and a second fifth alignment mark 252_3 are further disposed in the second area DS2, the disclosure is not limited thereto. A larger number of the fifth alignment marks may be disposed therein.

When the second area DS2 of the display panel 300 is bent downward from the first bending line BL1, a perspective effect in a region in the second area DS2 may increase as a spacing between the region and the first bending line BL1 in the first direction DR1 perpendicular to the extended second direction DR2 increases. That is, an orthogonal projection area in a region of each of the second alignment mark 220_3, the first fifth alignment mark 251_3, and the second fifth alignment mark 252_3 disposed in the second area DS2 may be greatly reduced as a spacing between the region and the first bending line BL1 in the first direction DR1 gradually increases.

According to an embodiment, a third area as an area of each of the first fifth alignment mark 251_3 and the second fifth alignment mark 252_3 may be larger than a second area of the second alignment mark 220_3. As shown in the drawing, a first fifth first-directional dimension DM5$a$ measured in the first direction DR1 of the first fifth alignment mark 251_3 may be larger than a second first-directional dimension DM2_3 of the second alignment mark 220_3. A first fifth second-directional dimension H5$a$ measured in the second direction DR2 of the first fifth alignment mark 251_3 may be larger than the second second-directional dimension H2_3 of the second alignment mark 220_3. Similarly, a second fifth first-directional dimension DM5b and a second fifth second-directional dimension H5b of the second fifth alignment mark 252_3 may be respectively larger than the first fifth first-directional dimension DM5a and the first fifth second-directional dimension H5a of the first fifth alignment mark 251_3. As a position is displaced from the second alignment mark 220_3 toward the second fifth alignment mark 252_3, a spacing between the position and the first bending line BL1 may increase. Thus, when the second area DS2 of the display panel 300 is bent, the orthogonal projection area of a region of each of the first fifth alignment mark 251_3 and the second fifth alignment mark 252_3 may be greatly reduced as a spacing between the region and the first bending line BL1 may increase. Accordingly, as a position is displaced from the second alignment mark 220_3 to the second fifth alignment mark 252_3, planar sizes of the second alignment mark 220_3 to the second fifth alignment mark 252_3 may increase in this order in the non-bent state of the display panel 300 may increase, while the orthogonal projection areas of the first alignment mark 210_3, the second alignment mark 220_3, the first fifth alignment mark 251_3, and the second fifth alignment mark 252_3 may be identical to each other in the bent state of the display panel 300. However, the disclosure is not limited thereto.

In one embodiment, for example, the display panel 300 may include the first bending line BL1 extending in the second direction DR2 and the third bending line BL3 extending in the first direction DR1 and intersecting the first bending line BL1. The first bending line BL1 and the third bending line BL3 may intersect each other at the first bending intersection point DBP1. The first bending intersection point DBP1 may be located at a boundary between the fifth non-display area NDA5 and the fifth display area DA5. When the display panel 300 is bent from the first bending line BL1 and the third bending line BL3, the fifth non-display area NDA5 where the second area DS2 and the third area DS3 intersect with each other may be bent along different bending lines. According to an embodiment, the plurality of alignment marks 200 may be disposed in an area where different bending lines BL intersect with each other. Thus, a bent angle in the intersecting area may be calculated based on the alignment marks 200.

FIG. 19 is an enlarged view showing a portion of a display panel according to an alternative embodiment. FIG. 20 is a plan view showing a Q4 portion in a non-bent state of the display panel of FIG. 19. FIG. 21 is a plan view showing the Q4 portion in a bent state of the display panel of FIG. 19.

Referring to FIG. 19 to FIG. 21, in an embodiment of the display panel 300_4, the alignment mark 200 may be disposed on an area where the second area DS2 bent from the first bending line BL1 and the third area DS3 bent from the third bending line BL3 intersect with each other. The area where the second area DS2 and the third area DS3 intersect with each other may be a doble-curved area bent from a plurality of bending lines BL1 and BL3. A plurality of alignment marks 200 may be disposed in the doble-curved area. Thus, a bent angle of the doble-curved area may be calculated based on a change in the orthogonal projection area of each mark.

The alignment mark 200 according to an embodiment may further include a sixth alignment mark 260_4 disposed in the first area DS1 and having a sixth area 260S_4 and having one side contacting the first bending intersection point DBP1_4, and a seventh alignment mark 270_4 disposed in the fifth non-display area NDA5 and facing toward the sixth alignment mark 260_4 while the first bending intersection point DBP1_4 is interposed therebetween, and having a seventh area 270S_4 different from the sixth area 260S_4. Further, the alignment mark 200 according to an embodiment may further include an eighth alignment mark 280_4 which may be spaced apart from the first bending line BL1 and the third bending line BL3 and may be disposed in the fifth non-display area NDA5, and have an eighth area 280S_4 larger than the seventh area 270S_4.

The sixth alignment mark 260_4 may substantially correspond to the first alignment mark 210 described above with reference to FIG. 5 to FIG. 10. The sixth alignment mark 260_4 may be disposed on the first area DS1 as a flat area. Even when the display panel 300 is bent, a sixth orthogonal projection area 260R_4 thereof may not change. However, unlike the first alignment mark 210, the sixth alignment mark 260_4 may be disposed to overlap the third bending line BL3 intersecting the first bending line BL1. Accordingly, the sixth alignment mark 260_4 may be used to measure a bent angle of the third area DS3 bent from the third bending line BL3 and the first bending line BL1.

The seventh alignment mark 270_4 may face toward the sixth alignment mark 260_4 while the first bending intersection point DBP1_4 is disposed therebetween. The seventh alignment mark 270_4 may correspond to the second alignment mark 220 as described above with reference to FIG. 5 to FIG. 10. In such an embodiment, the seventh alignment mark 270_4 may be disposed to overlap the third bending line BL3, and may be partially disposed in the non-display area located in the doble-curved area of the display panel 300, that is, the fifth non-display area NDA5. The seventh alignment mark 270_4 is located in both of the second area DS2 and the third area DS3 that are respectively bent from the first bending line BL1 and the third bending line BL3. Thus, when the display panel 300 is bent, the orthogonal projection area of the seventh alignment mark 270_4 may change in the first direction DR1 and the second direction DR2. In such an embodiment, the orthogonal projection area of the seventh alignment mark 270_4 may change in the first direction DR1 as the display panel is bent at the first bending line BL1. As the display panel is bent at the third bending line BL3, the orthogonal projection area of the seventh alignment mark 270_4 may change in the second direction DR2.

The eighth alignment mark 280_4 may be spaced apart from the first bending line BL1 and the third bending line BL3 and may be disposed in the fifth non-display area NDA5 as the doble-curved area where the second area DS2 and the third area DS3 intersect with each other. Like the seventh alignment mark 270_4, the orthogonal projection area of the eighth alignment mark 280_4 may change in the first direction DR1 as the display panel is bent at the first bending line BL1. As the display panel is bent at the third bending line BL3, the orthogonal projection area of the eighth alignment mark 280_4 may change in the second direction DR2. However, unlike the seventh alignment mark 270_4, the eighth alignment mark 280_4 may be spaced apart from the first bending line BL1 and the third bending line BL3. Thus, the eighth area 280S_4 of the eighth alignment mark 280_4 may be larger than the seventh area 270S_4 of the seventh alignment mark 270_4.

FIG. 20 shows the sixth alignment mark 260_4, the seventh alignment mark 270_4 and the eighth alignment mark 280_4 when the display panel 300 of FIG. 19 is in a non-bent state. FIG. 21 shows the sixth alignment mark 260_4, the seventh alignment mark 270_4 and the eighth alignment mark 280_4 when the display panel 300 is in the bent state.

In an embodiment, as shown in FIG. 20, when the display panel 300 is in the non-bent state, the sixth area 260S_4 of the sixth alignment mark 260_4, the seventh area 270S_4 of the seventh alignment mark 270_4 and the eighth area 280S_4 of the eighth alignment mark 280_4 may be equal to a sixth orthogonal projection area, a seventh orthogonal projection area and an eighth orthogonal projection area on the reference surface RS thereof, respectively. In FIG. 20, it is shown that the sixth area 260S_4, the seventh area 270S_4 and the eighth area 280S_4 are defined on the reference surface RS. As the display panel 300 is in the non-bent state, it may be understood that the sixth area 260S_4 of the sixth alignment mark 260_4, the seventh area 270S_4 of the seventh alignment mark 270_4 and the eighth area 280S_4 of the eighth alignment mark 280_4 are equal to the sixth orthogonal projection area, the seventh orthogonal projection area and the eighth orthogonal projection area on the reference surface RS thereof, respectively.

According to an embodiment, the areas of the sixth alignment mark 260_4, the seventh alignment mark 270_4, and the eighth alignment mark 280_4 may increase in this order. A second-directional dimension H6_4 and a sixth first-directional dimension DM6_4 of the sixth alignment mark 260_4 may be smaller than a seventh second-directional dimension H7_4 and a seventh first-directional dimension DM7_4 of seventh alignment mark 270_4, respectively. The seventh second-directional dimension H7_4 and the seventh first-directional dimension DM7_4 of the seventh alignment mark 270_4 may be smaller than an eighth second-directional dimension H8_4 and an eighth first-directional dimension DM8_4 of the eighth alignment mark 280_4, respectively.

In such an embodiment, as shown in FIG. 21, when the display panel 300 is bent along the first bending line BL1 and the third bending line BL3, an orthogonal projection area of each of the seventh alignment mark 270_4 and the eighth alignment mark 280_4 disposed in the second area DS2 and the third area DS3 may be reduced. According to an embodiment, in the bent state of the display panel 300, each of a seventh orthogonal projection area 270R'_4 of the seventh alignment mark 270_4 and an eighth orthogonal projection area 280R'_4 of the eighth alignment mark 280_4 may be equal to a sixth orthogonal projection area 260R_4 of the sixth alignment mark 260_4. The sixth alignment mark 260_4 may be disposed in the first area DS1. Thus, even when the display panel 300 is bent, a size of the sixth orthogonal projection area 260R_4 may not change. On the contrary, a size of each of the seventh orthogonal projection area 270R'_4 of the seventh alignment mark 270_4 and the eighth orthogonal projection area 280R'_4 of the eighth alignment mark 280_4 may change when the display panel 300 is bent. In such an embodiment, the eighth orthogonal projection area 280R'_4 of the eighth alignment mark 280_4 spaced from the first bending line BL1 and the third bending line BL3 may greatly change. In an embodiment, the sizes of the seventh alignment mark 270_4 and the eighth alignment mark 280_4 may be designed in a way such that a size of each of the seventh orthogonal projection area 270R'_4 and the eighth orthogonal projection area 280R'_4 is equal to a size of the sixth orthogonal projection area 260R_4 when the display panel 300 is bent at a preset bent angle.

Alternatively, according to an embodiment, in the manufacturing process of the display device 10, the bent angle of the display panel 300 may be determined based on a measuring result of a change in a size of each of the seventh orthogonal projection area 270R'_4 of the seventh alignment mark 270_4 and the eighth orthogonal projection area 280R'_4 of the eighth alignment mark 280_4. Detailed descriptions thereof is the same as those described above, and thus is omitted.

FIG. 22 and FIG. 23 are enlarged views showing a portion of a display panel according to another alternative embodiment.

Referring to FIG. 22, in an embodiment of a display panel 300_5, each of a sixth alignment mark 260_5, a seventh alignment mark 270_5, and an eighth alignment mark 280_5 may be located between the first bending line BL1 and the third bending line BL3. Unlike FIG. 21, each of the sixth alignment mark 260_5 and the seventh alignment mark 270_5 do not overlap the third bending line BL3, and may be located between the first bending line BL1 and the third bending line BL3. Accordingly, the sixth alignment mark 260_5 may be located in the first area DS1. When the second area DS2 and the third area DS3 are bent, a sixth orthogonal projection area 260R thereof may be constantly maintained. The alignment marks of FIG. 22 may be the same as the alignment marks of FIG. 21 when the latter rotate by a certain angle around the first bending intersection point DBP1_5. A detailed description thereof will be omitted.

Referring to FIG. 23, according to an embodiment of a display panel 300_6, a first bending intersection point DBP1_6 where the first bending line BL1 and the third bending line BL3 intersect with each other may be located in the fifth non-display area NDA5. Accordingly, all of the sixth alignment mark 260_6, the seventh alignment mark 270_6 and the eighth alignment mark 280_6 may be located in the non-display area NDA. At least a portion of the non-display area NDA may be located on the non-bent first area DS1. The display panel of FIG. 23 is the same as that of FIG. 22, except for a location of the first bending intersection point DBP1_6 and except that a portion of the non-display area NDA may be located on the first area DS1. Thus, a detailed description will be omitted.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

The invention claimed is:

1. A display device comprising:
   a display area and a non-display area surrounding the display area;
   a first bending line defined on the display area, wherein the first bending line includes a portion extending in a first direction;
   a first area located at one side around the first bending line;
   a second area located at an opposite side around the first bending line, wherein the second area is bent in one direction relative to the first area and from the first bending line;
   a first alignment mark disposed in the first area and having a first alignment mark area; and
   a second alignment mark disposed in the second area and facing toward the first alignment mark while the first bending line is disposed between the first and second alignment marks, wherein the second alignment mark has a second alignment mark area different from the first alignment mark area, wherein the display area includes:
a first display area disposed in the first area around the first bending line; and
a second display area disposed in the second area around the first bending line,
wherein the first alignment mark is disposed in the first display area, and the second alignment mark is disposed in the second display area.

2. The display device of claim 1, wherein a first side of the first alignment mark and a second side of the second alignment mark contact each other at the first bending line, wherein the second area is larger than the first area.

3. The display device of claim 2, wherein a first second-directional dimension of the first alignment mark measured in a second direction perpendicular to the first direction is smaller than a second second-directional dimension of the second alignment mark measured in the second direction.

4. The display device of claim 3, wherein a first first-directional dimension of the first alignment mark measured in the first direction is smaller than a second first-directional dimension of the second alignment mark measured in the first direction.

5. The method of claim 2, wherein an imaginary reference surface parallel to the first area and spaced apart from the first area in a third direction in which the second area is bent is defined,
wherein a size of a first orthogonal projection area of the first alignment mark projected in the third direction onto the imaginary reference surface is the same as a size of a second orthogonal projection area of the second alignment mark projected in the third direction onto the imaginary reference surface.

6. The display device of claim 5, further comprising:
a third alignment mark spaced apart from and facing toward the first alignment mark while the first bending line is disposed therebetween,
wherein the third alignment mark is disposed in the second area, and has a third area larger than the second area.

7. The display device of claim 6, wherein a size of a third orthogonal projection area of the third alignment mark projected in the third direction onto the imaginary reference surface is the same as each of the size of the first orthogonal projection area and the size of the second orthogonal projection area.

8. The display device of claim 1, further comprising: a second bending line extending in a second direction perpendicular to the first direction, wherein the second bending line intersects the first bending line, and the first area is disposed at one side around the second bending line; and a third area located at an opposite side around the second bending line, wherein the third area is bent in one direction relative to the first area and from the second bending line, wherein the display area further includes a third display area disposed in the third area around the second bending line.

9. The display device of claim 8, further comprising:
a fourth alignment mark disposed in the first area and having a fourth area; and
a fifth alignment mark disposed in the third area and facing toward the fourth alignment mark while the second bending line is disposed between the fourth and fifth alignment marks, wherein the fifth alignment mark has a fifth area different from the fourth area.

10. The display device of claim 8, wherein the non-display area includes:
a first non-display area extending in the first direction, disposed in the second area, and located on one side of the second display area;
a second non-display area extending in the second direction, disposed in the third area, and located on one side of the third display area; and
a third non-display area located in an area where the first non-display area and the second non-display area intersect with each other,
wherein a bending intersection point as an intersection point between the first bending line and the second bending line is disposed at a boundary between the third non-display area and the first display area.

11. The display device of claim 10, further comprising:
a sixth alignment mark disposed in the first area, having a sixth area, and having a sixth side contacting the bending intersection point; and
a seventh alignment mark disposed in the third non-display area and facing toward the sixth alignment mark while the bending intersection point is disposed between the sixth and seventh alignment marks, wherein the seventh alignment mark has a seventh area different from the sixth area.

12. The display device of claim 11, further comprising:
an eighth alignment mark spaced from the first bending line and the second bending line and disposed in the third non-display area, wherein the eight alignment mark has an eighth area larger than the seventh area.

13. A display device comprising:
a first bending line extending in a first direction;
a second bending line extending in a second direction perpendicular to the first direction and intersecting the first bending line;
a first area surrounded with the first bending line and the second bending line;
a second area bent from the first bending line;
a third area bent from the second bending line;
a fourth area where the second area and the third area intersect with each other;
a first alignment mark disposed on the first area and having a first alignment mark area; and
a second alignment mark disposed in at least one selected from the second area, the third area and the fourth area,
wherein the second alignment mark has a second alignment mark area larger than the first alignment mark area, the second alignment mark faces toward the first alignment mark,
wherein the second alignment mark disposed in the second area and the first alignment mark contact each other at the first bending line.

14. The display device of claim 13,
wherein the second alignment mark disposed in the third area and the first alignment mark contact with each other at the second bending line.

15. The display device of claim 14, wherein the second alignment mark disposed in the fourth area is spaced apart from each of the first bending line and the second bending line.

* * * * *